United States Patent
Pio

(10) Patent No.: US 9,595,667 B2
(45) Date of Patent: Mar. 14, 2017

(54) THREE DIMENSIONAL MEMORY ARRAY ARCHITECTURE

(71) Applicant: Micron Technology, Inc., Boise, ID (US)

(72) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/011,816

(22) Filed: Feb. 1, 2016

(65) Prior Publication Data
US 2016/0149126 A1 May 26, 2016

Related U.S. Application Data

(60) Continuation of application No. 14/470,247, filed on Aug. 27, 2014, now Pat. No. 9,252,362, which is a
(Continued)

(51) Int. Cl.
*H01L 45/00* (2006.01)
*H01L 27/22* (2006.01)
(Continued)

(52) U.S. Cl.
CPC .............. *H01L 45/06* (2013.01); *H01L 27/10* (2013.01); *H01L 27/101* (2013.01); *H01L 27/224* (2013.01); *H01L 27/249* (2013.01); *H01L 27/2427* (2013.01); *H01L 45/04* (2013.01); *H01L 45/1683* (2013.01);
(Continued)

(58) Field of Classification Search
None
See application file for complete search history.

(56) References Cited

U.S. PATENT DOCUMENTS 6,869,841 B2   3/2005   Xu
6,906,940 B1   6/2005   Lue
(Continued)

FOREIGN PATENT DOCUMENTS

CN   101409290 A   4/2009
CN   101872778 A   10/2010
(Continued)

OTHER PUBLICATIONS

Definition of 'ring' downloaded from URL http://www.merriam-webster.com/dictionary/ring on Aug. 2, 2016.*
(Continued)

*Primary Examiner* — Joseph Schoenholtz
(74) *Attorney, Agent, or Firm* — Brooks, Cameron & Huebsch, PLLC

(57) ABSTRACT

Three dimension memory arrays and methods of forming the same are provided. An example three dimension memory array can include a stack comprising a plurality of first conductive lines separated from one another by at least an insulation material, and at least one conductive extension arranged to extend substantially perpendicular to the plurality of first conductive lines, such that the at least one conductive extension intersects a portion of at least one of the plurality of first conductive lines. Storage element material is formed around the at least one conductive extension. Cell select material is formed around the at least one conductive extension.

16 Claims, 14 Drawing Sheets

Related U.S. Application Data division of application No. 13/600,699, filed on Aug. 31, 2012, now Pat. No. 8,841,649.

(51) Int. Cl.
   *H01L 27/24* (2006.01)
   *H01L 27/10* (2006.01)
   *H01L 27/06* (2006.01)

(52) U.S. Cl.
   CPC ........ *H01L 27/0688* (2013.01); *H01L 45/126* (2013.01); *H01L 45/1226* (2013.01); *H01L 45/144* (2013.01)

(56) References Cited

U.S. PATENT DOCUMENTS

| | | | |
|---|---|---|---|
| 7,345,899 B2 | 3/2008 | Nirschl et al. | |
| 7,382,647 B1 | 6/2008 | Gopalakrishnan | |
| 7,800,091 B2 | 9/2010 | Kamigaichi et al. | |
| 7,910,914 B2 | 3/2011 | Tanaka et al. | |
| 7,943,515 B2 | 5/2011 | Scheuerlein | |
| 7,989,789 B2 | 8/2011 | Toda | |
| 8,124,968 B2 | 2/2012 | Koo et al. | |
| 8,173,987 B2 | 5/2012 | Lung | |
| 8,188,517 B2 | 5/2012 | Choi | |
| 8,194,433 B2 | 6/2012 | Parkinson | |
| 8,198,667 B2 | 6/2012 | Kuniya et al. | |
| 8,208,279 B2 | 6/2012 | Lue | |
| 8,299,571 B2 | 10/2012 | Ozawa et al. | |
| 8,450,713 B2 | 5/2013 | Awaya et al. | |
| 8,502,184 B2 | 8/2013 | An et al. | |
| 8,664,633 B2 * | 3/2014 | Park | H01L 27/101 257/296 |
| 8,729,523 B2 | 5/2014 | Pio | |
| 8,729,624 B2 | 5/2014 | Fukuzumi et al. | |
| 8,841,649 B2 | 9/2014 | Pio | |
| 2006/0073652 A1 | 4/2006 | Pellizzer et al. | |
| 2006/0110878 A1 | 5/2006 | Lung et al. | |
| 2007/0096090 A1 | 5/2007 | Dennison | |
| 2009/0097321 A1 | 4/2009 | Kim et al. | |
| 2009/0302303 A1 | 12/2009 | Lowrey | |
| 2009/0321878 A1 * | 12/2009 | Koo | H01L 27/101 257/536 |
| 2010/0012916 A1 | 1/2010 | Kuo et al. | |
| 2010/0163822 A1 | 7/2010 | Ovshinsky et al. | |
| 2010/0252909 A1 | 10/2010 | Nakanishi et al. | |
| 2010/0259970 A1 | 10/2010 | Toda et al. | |
| 2010/0270529 A1 * | 10/2010 | Lung | G11C 13/0004 257/4 |
| 2010/0270593 A1 | 10/2010 | Lung et al. | |
| 2011/0140068 A1 | 6/2011 | Ozawa et al. | |
| 2011/0147690 A1 | 6/2011 | Yang | |
| 2011/0215394 A1 | 9/2011 | Komori et al. | |
| 2011/0272663 A1 | 11/2011 | An et al. | |
| 2011/0299321 A1 | 12/2011 | Murooka | |
| 2011/0299328 A1 | 12/2011 | Liu | |
| 2011/0316063 A1 * | 12/2011 | Tang | H01L 27/0688 257/314 |
| 2012/0025164 A1 | 2/2012 | Deweerd et al. | |
| 2012/0256154 A1 | 10/2012 | Dennison et al. | |
| 2012/0287697 A1 | 11/2012 | Hanzawa et al. | |
| 2012/0298946 A1 | 11/2012 | Magistretti et al. | |
| 2012/0313066 A1 * | 12/2012 | Park | H01L 45/04 257/2 |
| 2014/0043911 A1 * | 2/2014 | Samachisa | G11C 13/003 365/185.18 |
| 2014/0061574 A1 | 3/2014 | Pio | |
| 2014/0312296 A1 * | 10/2014 | Jo | G11C 13/0007 257/4 |
| 2015/0188051 A1 * | 7/2015 | Gee | H01L 45/085 438/382 |

FOREIGN PATENT DOCUMENTS

| | | |
|---|---|---|
| CN | 101937919 A | 1/2011 |
| JP | 2007067403 A | 3/2007 |
| JP | 2007294948 A | 11/2007 |
| JP | 2008181978 A | 8/2008 |
| JP | 2008277543 A | 11/2008 |
| JP | 2009081251 A | 4/2009 |
| JP | 2010282673 A | 12/2010 |
| JP | 2010287872 A | 12/2010 |
| JP | 2011090758 A | 5/2011 |
| JP | 2011129639 A | 6/2011 |
| JP | 2011253941 A | 12/2011 |
| JP | 2013531887 A | 8/2013 |
| KR | 20080096432 A | 10/2008 |
| KR | 20100001260 A | 1/2010 |
| KR | 10-20110001487 A | 1/2011 |
| KR | 10-20110123005 A | 11/2011 |
| KR | 10-20120094339 A | 8/2012 |
| TW | I222146 B | 10/2004 |
| TW | 200945564 A | 11/2009 |
| TW | 200947680 A | 11/2009 |
| TW | 200951951 A | 12/2009 |
| TW | 201039476 A | 11/2010 |
| WO | 2010010688 A | 1/2010 |

OTHER PUBLICATIONS

Office Action from Japanese patent application No. 2015-530113, May 10, 2016, 9 pp.

Office Action from related Japanese patent application No. 2015-530120, dated May 31, 2016, 16 pp.

Office Action from related Taiwan patent application No. 102131392, dated Jun. 29, 2015, 18 pp.

Office Action from related Taiwan patent application No. 102131392, dated Feb. 12, 2015, 14 pp.

International Search Report and Written Opinion of international application No. PCT/US2013/057657, dated Dec. 27, 2013, 16 pp.

Chen, et al. "An access-transistor-free (0T/1R) non-volatile resistance random access memory (RRAM) using a novel threshold switching, self-rectifying chalcogenide device," IEEE International Electron Devices Meeting, IEDM Technical Digest '03, Dec. 2003, 4 pp.

Raoux, et al. "Phase-change random access memory: A scalable technology," IBM Journal of Research and Development, vol. 52, No. 4/5, pp. 465-479, Jul./Sep. 2008.

Lu, NTUEE Electronics downloaded from URL < http://cc.ee.ntu.edu.tw/~lhlu/eecourses/Electronics1/Electronics_Ch3.pdf > on Nov. 2, 2013, 14 pp.

Endoh, et al. "Novel ultra high density flash memory with a stacked-surrounding gate transistor (S-SGT) structured cell," IEEE International Electron Devices Meeting, 2001. IEDM Technical Digest '01, IEEE transactions on electron devices, vol. 50. No. 4, published Apr. 2003, 7 pp.

Ou, "Arrary Architecture for Non-Volatile 3-Dimensional Cross Point Memory", Diss, Stanford University Department of Electrical Engineering Mar. 2010, 119 pp.

Kau, et al., "A Stackable Cross Point Phase Change Memory," IEEE International Electron Devices Meeting, IEDM Technical Digest '09, Dec. 2009, 4 pp.

Definition of Protrude downloaded from URL < http://www/merriam-webster.com/dictionary/protrude > on Jun. 1, 2015.

Definition of 'Intersect' downloaded from URL , http://www.merriam-webster.com/dictionary/intersect. on Jun. 1, 2015.

Czubatyj, et al. "Invited Paper: Thin-Film Ovanic Threshold Switch: Its Operation and Application in Modern Integrated Circuits", Electronic Materials Letters, vol. 8, No. 2, published 2012, pp. 157-167.

Wong, et al. "Phase Change Memory", Proceedings of the IEEE, vol. 98, No. 12, pp. 2201-2227, Dec. 2010.

Anbarasu, et al. "Understanding the Structure and Properties of Phase Change Materials for Data Storage Application," Journal of the Indian Institute of Science, 91:2, pp. 259-274, Jun. 2011.

(56) References Cited

OTHER PUBLICATIONS

International Search Report and Written Opinion of international application No. PCT/US2013/057620, dated Dec. 11, 2013, 10 pp.
Notice of Reasons for Rejection from related Korean patent application No. 10-2015-7006865, dated Mar. 17, 2016, 13 pp.
Supplementary Search Report from related European patent application No. 13833302.6, dated Apr. 1, 2016, 7 pp.
Supplementary Search Report from European patent application No. 13832624.4, dated Mar. 29, 2016, 10 pp.
Non-Final Office Action from U.S. Appl. No. 14/268,649, dated Jun. 11, 2015, 9 pp.
Final Office Action from U.S. Appl. No. 14/268,649, dated Dec. 9, 2015, 13 pp.
Office Action from related Korean patent application No. 10-2015-7006865, dated Sep. 19, 2016, 6 pp.
Communication pursuant to Article 94(3) EPC from related European patent application No. 13833302.6, dated Nov. 30, 2016, 5 pp.
Office Action from related Chinese patent application No. 201380049045.1, dated Nov. 4, 2016, 16 pp.

\* cited by examiner

THREE DIMENSIONAL MEMORY ARRAY ARCHITECTURE

PRIORITY INFORMATION

This application is a Continuation of U.S. application Ser. No. 14/470,247 filed Aug. 27, 2014, which is a Divisional of U.S. application Ser. No. 13/600,699 filed Aug. 31, 2012, now U.S. Pat. No. 8,841,649, the specification of which is incorporated in its entirety herein by reference.

TECHNICAL FIELD

The present disclosure relates generally to semiconductor devices, and more particularly to three dimensional memory array architectures and methods of forming same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Constant challenges related to memory device fabrication are to decrease the size of a memory device, increase the storage density of a memory device, and/or limit memory device cost. Some memory devices include memory cells arranged in a two dimensional array, in which memory cells are all arranged in a same plane. In contrast, various memory devices include memory cells arranged into a three dimensional (3D) array having multiple levels of memory cells.

DETAILED DESCRIPTION

Figure 1:
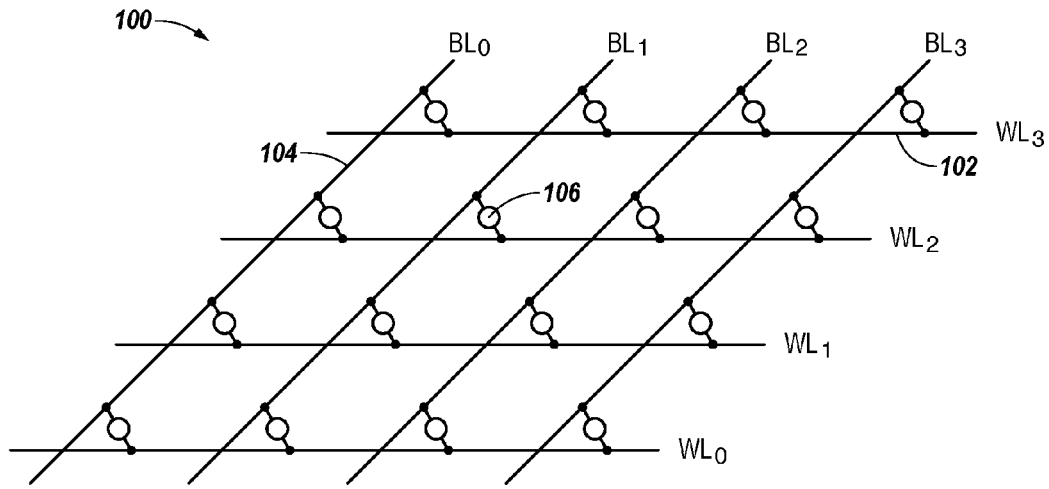
FIG. 1 illustrates a prior art two dimensional memory array.

Three dimension (3D) memory arrays and methods of forming the same are provided. An example three dimension memory array can include a stack comprising a plurality of first conductive lines separated from one another by at least an insulation material, and at least one conductive extension arranged to extend substantially perpendicular to the plurality of first conductive lines, such that the at least one conductive extension intersects a portion of at least one of the plurality of first conductive lines. Storage element material is formed around the at least one conductive extension. Cell select material is formed around the at least one conductive extension.

Embodiments of the present disclosure implement a vertical integration of phase change material (PCM) memory cell. The disclosed three dimensional memory array is denser than conventional two dimensional memory arrays. Furthermore, the fabrication process can be less complex and less expensive than other approaches, e.g., by reducing a mask count associated with forming a 3D array, to fabricating three dimensional memory array architectures in that a quantity of mask count is reduced. Therefore, the fabrication process of the present disclosure can be less expensive than that of previous approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

FIG. 1 illustrates a prior art two dimensional memory array 100. Various memory devices can include a memory array 100. The memory array 100 can include a plurality of word lines 102, and a number of bit lines 104. The word lines 102 are arranged substantially parallel one another at one level, and the bit lines 104 are arranged substantially parallel one another at a different level. The word lines 102 and bit lines 104 are further arranged substantially perpendicular, e.g., orthogonal, to one another. The indices shown for each word line 102 and bit line 104 indicate the ordering of the respective lines within a particular level.

In such architectures, the memory cells 106 can be arranged in a matrix of rows and columns. The memory cells 106 can be located at the crossings of the word lines 102 and the bit lines 104. That is, the memory cells 106 are arranged in a cross point architecture. The memory cells 106 are located where word lines 102 and the bit lines 104 pass near one another, e.g., cross, overlap, etc. The word lines 102 and the bit lines 104 do not intersect one another since the word lines 102 and the bit lines 104 are formed at different levels.

Figure 2:
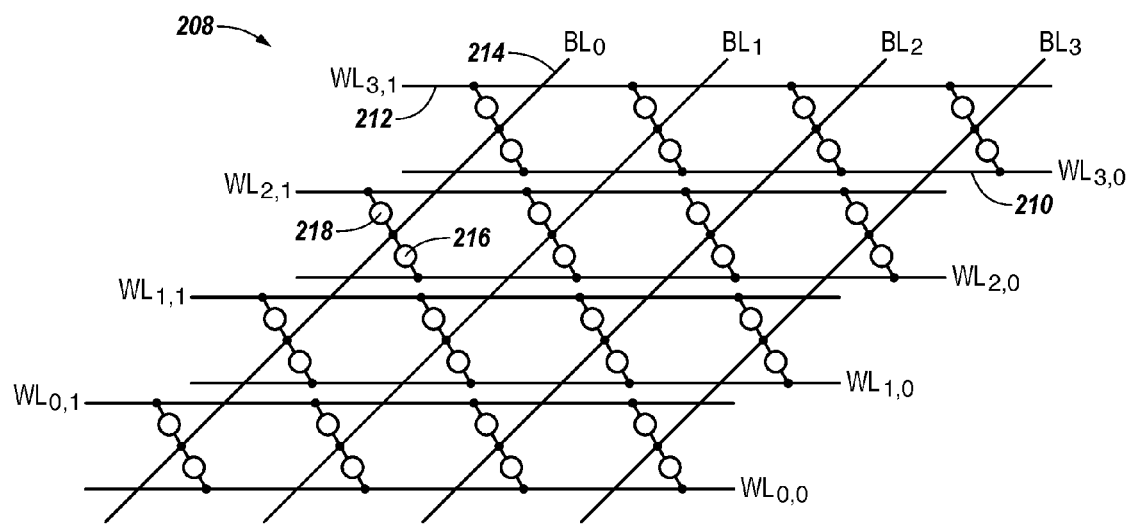
FIG. 2 illustrates a prior art three dimensional memory array.

FIG. 2 illustrates a prior art three dimensional memory array 208. The memory array 208 can include a plurality of word lines 210, 212, and a number of bit lines 214. Word lines 210 are arranged substantially parallel one another at one level and word lines 212 are arranged substantially parallel one another at a different level. As shown in FIG. 2, bit lines 214 are arranged substantially parallel one another at a level different than either of the levels at which word lines 210 and 212 are located, e.g., between the levels at which word lines 210 and 212 are located. The bit lines 214 are further arranged substantially perpendicular, e.g., orthogonal, to word lines 210, 212.

Memory cells 216, 218 are shown in FIG. 2 arranged in a cross point architecture at the crossings of the word lines 210, 212 and the bit lines 214. Memory cells 216 are arranged between word lines 210 and bit lines 214, and memory cells 218 are arranged between word lines 212 and bit lines 214. As such, the memory cells are arranged in multiple levels, each level having memory cells organized in a cross point architecture. The levels are formed at different levels from one another, thereby being vertically stacked. Memory cells are formed at levels between levels at which word lines 212 and bit lines 214 are formed.

The three dimensional memory array 208 shown in FIG. 2 includes memory cells 216, 218 having a common bit line 214, but separate word lines 210, 212. That is, compared to memory array 100 shown in FIG. 1, the additional level of memory cells in the memory array 208 necessitates addition of another level of word lines, e.g., word lines 212 above memory cells 218. Bit line 214 is common to those memory cells, 216 and 218, that are located vertically adjacent the bit line 214, e.g., directly above and directly below bit line 214. Such adjacency limits bit line 214 being common to at most two memory cells. More generally, a three dimensional memory array may have more stacked levels, e.g., configured as shown in FIG. 2, than are shown in FIG. 2. However, the addition of more levels of memory cells, such as by stacking a plurality of memory arrays 208 atop one another, necessitates defining additional word lines for each additional level of memory cells, and defining additional bit lines for each new level (or at most, pair of levels) of additional memory cells.

The indices shown for each word line 210, 212 indicate the level and the ordering of the word lines within a particular level. For example, word line 210 ($WL_{3,0}$) is shown being located at position 3 within level 0, and word line 212 ($WL_{3,1}$) is shown being located at position 3 within level 1. As such, memory cell 216 is shown in FIG. 2 being located between bit line 214, i.e., $BL_0$, and the word line below bit line 214, i.e., $WL_{2,0}$, and memory cell 218 is shown in FIG. 2 being located between bit line 214, i.e., $BL_0$, and the word line above bit line 214, i.e., $WL_{2,1}$.

Figure 3:
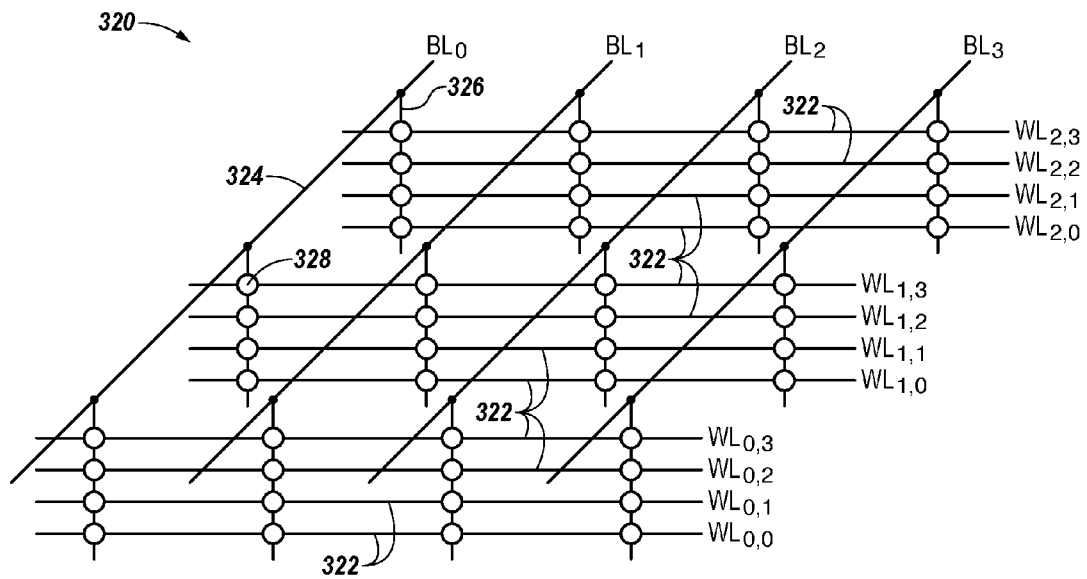
FIG. 3 illustrates a three dimensional memory array in accordance with a number of embodiments of the present disclosure.

FIG. 3 illustrates a three dimensional memory array 320 in accordance with a number of embodiments of the present disclosure. In a number of embodiments, access lines, which may be referred to as word lines (WLs), are disposed on a plurality of levels, e.g., elevations, decks, planes. For example, word lines can be disposed on N levels. Insulation material, e.g., dielectric material, separates the levels of word lines. As such, the levels of word lines separated by insulation material form a stack of WL/insulation materials. Data lines, which may be referred to as bit lines (BLs), are arranged substantially perpendicular to the word lines, and located at a level above the N levels of word lines, e.g., at the N+1 level. Each bit line can have a number of conductive extensions, e.g., vertical extensions, in proximity to the word lines, with a memory cell formed between the vertical extension and the word line.

The memory array 320 can include a plurality of conductive lines 322, e.g., access lines, which may be referred to herein as word lines, and conductive lines 324, e.g., data lines, which may be referred to herein as bit lines. Word lines 322 can be arranged into a number of levels. Word lines 322 are shown being arranged into four levels in FIG. 3. However, the quantity of levels into which the word lines 322 can be arranged are not limited to this quantity, and word line 322 can be arranged into more, or fewer, levels. Word lines 322 are arranged substantially parallel one another within a particular level. The word lines 322 can be aligned vertically in a stack. That is, word lines 322 in each of the multiple levels can be located at a same relative location within each level so as to be aligned with word lines 322 directly above and/or below. Insulation material (not shown in FIG. 3) can be located between the levels at which word lines 322 are formed and between word lines 322 at a particular level.

As shown in FIG. 3, bit lines 324 can be arranged substantially parallel one another at a level different than the levels at which word lines 322 are located, e.g., above the levels at which word lines 322 are located. That is, the bit lines can be located at the top of the memory array 320. The bit lines 324 can be further arranged substantially perpendicular, e.g., orthogonal, to word lines 322 so as to have overlappings, e.g., crossings at different levels, therebetween. However, embodiments are not limited to a strictly parallel/orthogonal configuration.

The indices shown for each word line 322 in FIG. 3 indicate the position, e.g., ordering, of the word lines within a particular level and the level. For example, word line $WL_{2,0}$ is shown being located at position 2 within level 0 (a word line at the bottom of a stack of word lines located at position 2), and word line $WL_{2,3}$ is shown being located at position 2 within level 3 (a word line at the top of a stack of word lines located at position 2). The quantity of levels into which the word lines 322 can be arranged, and the quantity of word lines 322 at each level can be more, or fewer, than the quantities shown in FIG. 3.

At each overlapping of a bit line 324 and a stack of word lines 322, a conductive extension 326 of the bit line 324 is oriented substantially perpendicular to the bit line 324 and the word lines 322, so as to intersect a portion of each word line 322 in the stack of word lines. For example, the conductive extension 326 of the bit line 324 can be arranged to extend vertically from the bit line 324 to intersect a portion the respective word lines 322 therebelow, as shown in FIG. 3. As shown, the conductive extension 326 can pass through a word line 322, so as to be surrounded entirely by the word line 322. According to a number of embodiments, the conductive extension 326 can pass near the word line 322, e.g., adjacent, such that a memory cell can be formed between the conductive extension 326 and the word line 322.

Memory cells 328 are shown in FIG. 3 arranged in a cross point architecture near the location of where the conductive extension 326 of a bit line 324 and the word lines 322 are in proximity to one another at different levels. In a number of embodiments, the memory cells 328 are located between the conductive extension 326 and the word lines 322. For example, where a conductive extension 326 passes through a portion of a word line 322, a memory cell 328 can be located between the conductive extension 326 and the word line 322.

As such, the memory cells 328 can be arranged in multiple levels, each level having memory cells organized in a cross point architecture. The levels of memory cells 328 can be formed at different levels from one another, thereby being vertically stacked. The three dimensional memory array 320 shown in FIG. 3 can include memory cells 328 having a common a bit line 324, but separate word lines 322. Although four levels of word lines 322 (and four corresponding levels of memory cells 328) are shown in FIG. 3, embodiments of the present disclosure are not so limited and can include more, or fewer, levels of word lines 322 (and corresponding levels of memory cells 328). Memory cells may be formed substantially at the same levels as word lines are formed.

According to a number of embodiments of the present disclosure, the memory cells 328 can be a resistance variable memory cell. For example, the memory cell 328 can include a phase change material (PCM), e.g., chalcogenide. Each memory cells 328 can also include a switch, e.g., a MOS transistor, a BJT, a diode, an ovonic threshold switch (OTS), among other types of switches. An OTS can comprise chalcogenide material, such as a chalcogenide material different than that used for the memory element.

According to embodiments, a memory cell 328 can include a storage element connected in series with a respective cell select device, e.g., cell access device, each formed concentrically around the conductive extension 326 as explained in further detail with respect to FIG. 5 below. A number of embodiments include a three dimension memory array of phase change material (PCM) and switch memory cells, which can be referred to as a 3D PCMS array. For simplicity, FIG. 3 shows a memory cell 328 located at an intersection of an extension 326 and a word line 322. However, embodiments of the present disclosure are not so limited and a memory cell 328 can be located near a crossing of an extension 326 and a word line 322.

Figure 4:
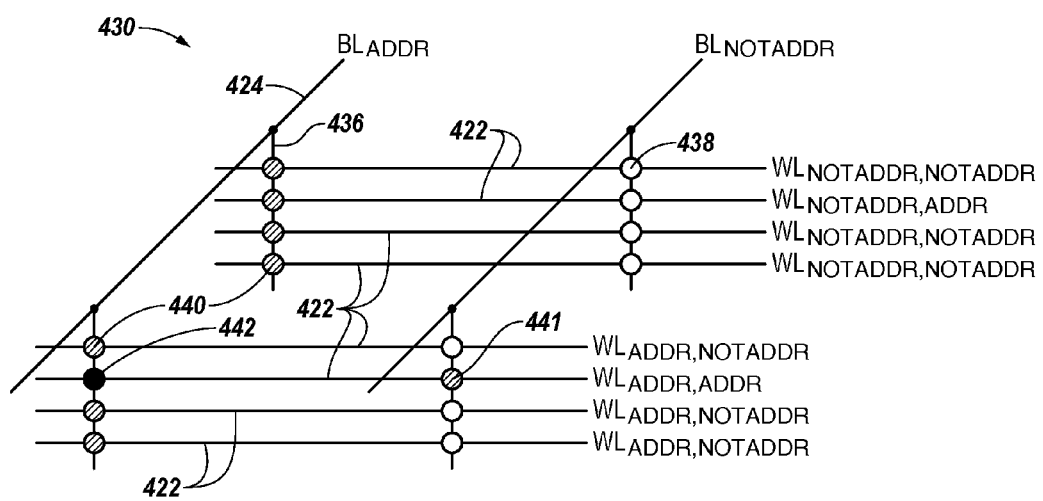
FIG. 4 illustrates a method for biasing of a three dimensional memory array in accordance with a number of embodiments of the present disclosure.

FIG. 4 illustrates a method for biasing of a three dimensional memory array in accordance with a number of embodiments of the present disclosure. FIG. 4 shows a memory array 430, which can be a portion of memory array 320 described with respect to FIG. 3. The memory array 430 can include a plurality of word lines 422, orthogonally-oriented bit lines 424, and conductive extensions 436 coupled to and arranged to extend vertically down from the bit lines 424, perpendicular to both the word lines 422 and bit lines 424.

To access, e.g., program or read, memory array 430, a balanced biasing scheme is adopted. The addressed word line 422, i.e., word lines at the addressed position on the addressed level, and the addressed bit line are biased so that the voltage difference across them exceeds the threshold voltage of the respective cell select device. Unaddressed word lines 422 and unaddressed bit lines 424 are biased so that the voltage difference across any other pair of addressed and/or unaddressed word lines 422 and bit lines 424, does not exceed the threshold voltage of the respective cell select device. For example, all other word lines 422 (including different word lines 422 located in a same level and word lines 422 located at different levels) and other bit lines 424 can be biased at an intermediate voltage, e.g., a reference voltage ($V_{REF}$) such as a mid-point voltage between addressed bit line and word line voltages.

The addressed bit line 424 is shown in FIG. 4 as $BL_{ADDR}$, and the unaddressed bit line 424 is shown as $BL_{NOTADDR}$. The indices shown for each word line 422 in FIG. 4 correspond to the position of the word lines within a particular level and the level. The word lines 422 shown in FIG. 4 are annotated with ADDR for an addressed level or position within a level, and NOTADDR for an unaddressed level or different word line position within a level. Therefore, the addressed word line 422 is shown in FIG. 4 as $WL_{ADDR, ADDR}$. Unaddressed word lines 422 shown in FIG. 4 as one of $WL_{NOTADDR, NOTADDR}$, $WL_{NOTADDR, ADDR}$, or $WL_{ADDR, NOTADDR}$, to indicate that the unaddressed word line 422 is located at a position and/or a level that is not addressed.

According to a number of embodiments, the unaddressed word lines 422 and unaddressed bit lines 424 can be biased to an intermediate voltage to reduce the maximum voltage drop with respect to either the addressed word line 422 or the addressed bit line 424. For example, the intermediate voltage can be chosen to be at a mid-point between the unaddressed word lines 422 and unaddressed bit lines. However, the intermediate voltage can be selected to be different than a mid-point voltage to minimize the disturb on the word lines 422 and bit lines 424.

FIG. 4 shows memory cell 442 between the addressed word line 422 and the addressed bit line 424 fully shaded to indicate the voltage difference across memory cell 442 exceeding the threshold voltage, V, of the associated cell select device. FIG. 4 shows undisturbed memory cells 438 between unaddressed word lines 422 and unaddressed bit lines 424 without any shading to indicate the voltage difference across memory cell 438 is insignificant, e.g., null, zero. FIG. 4 also shows disturbed memory cells 440 between unaddressed word lines 422 and the addressed bit line 424, and disturbed memory cell 441 between the addressed word line 422 and the unaddressed bit lines 424, as being partially shaded to indicate the voltage difference thereacross is some intermediate voltage that is less than the threshold voltage of the respective cell select device, e.g., V/2. It can be beneficial to bias unaddressed word lines 422 and unaddressed bit lines 424 to a same voltage.

The memory array structure has some similarities to three dimensional vertical channel NAND memories. However, accessing a memory cell involves passing current (which also flows in the addressed bit line 424 and/or addressed word line 422) through the memory cell, e.g., a resistance variable memory cell. The balanced biasing scheme of the present disclosure allows a voltage drop above threshold to be obtained only on an addressed cell, i.e., on addressed word line, level, and bit line, while only disturbing cells along the addressed word line and bit line, at not-addressed bit lines and word lines, respectively, e.g., at most a minimum leakage current flows through the not addressed cells.

Figure 5:
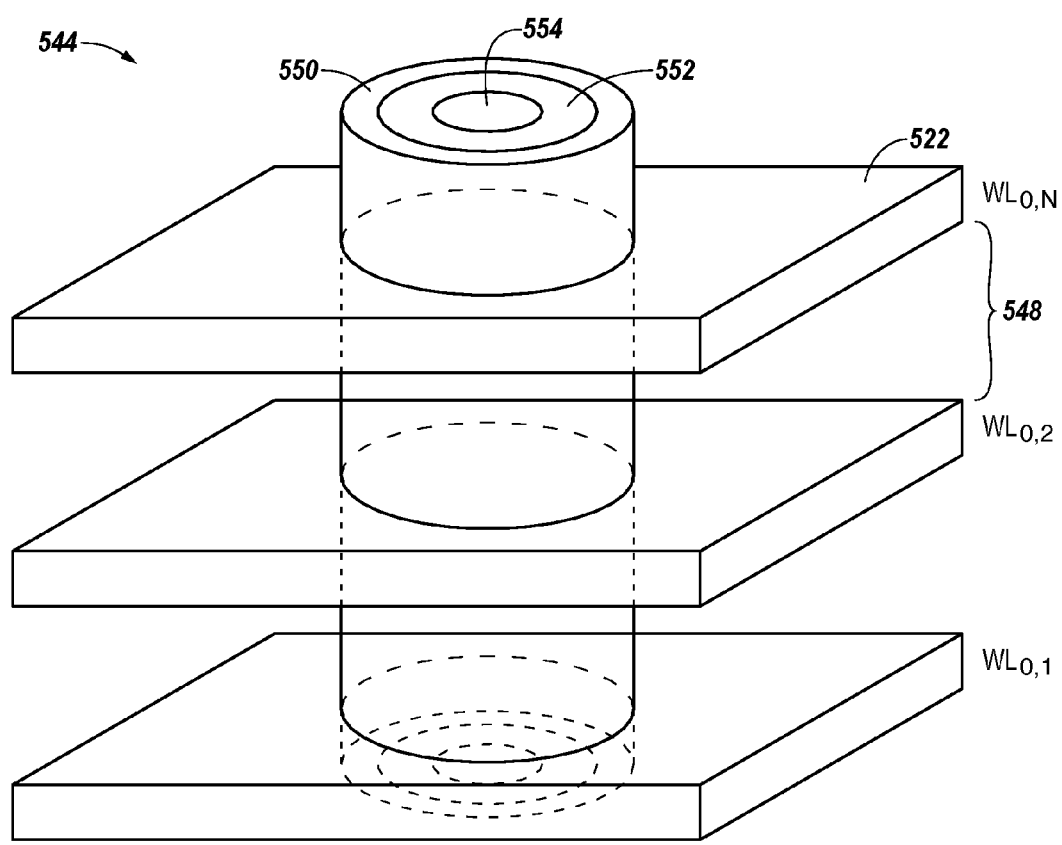
FIG. 5 illustrates concentric memory cells located within a plurality of conductive lines in accordance with a number of embodiments of the present disclosure.

FIG. 5 illustrates concentric memory cells located within a plurality of conductive lines in accordance with a number of embodiments of the present disclosure. Within this disclosure, "concentric" refers to structures substantially surrounding each other, and is not limited to exactly or quasi-exactly circular shapes or footprints, e.g., oval, square, or rectangular concentric memory cells may be formed. FIG. 5 shows a portion of a memory array, such as memory array 320 illustrated in FIG. 3. FIG. 5 shows a stack 544 comprising a plurality of conductive lines 522, e.g., word lines, at a number of levels separated from one another by at least an insulation material (not shown but located between conductive lines 522 at 548). A conductive extension 554 is arranged to extend perpendicular to the plurality of conductive lines 522. The conductive extension 554 is communicatively coupled at one end to a bit line (not shown in FIG. 5).

FIG. 5 shows the conductive extension 554 passing through each of the conductive lines 522 such that a cross section of the conductive extension 554 is completely surrounded by a respective conductive line 522. However, embodiments of the present disclosure are not so limited, and the conductive extension 554 can be arranged so as to intersect a portion of a respective conductive line 522 such that the conductive extension 554 is not completely surrounded by the conductive line 522, which is described further with respect to FIG. 6B. According to a number of embodiments, the conductive extension 554 passes in proximity to a respective conductive line 522 rather than through it.

FIG. 5 further shows storage element material 552, e.g., phase change material (PCM), and cell select device material 550, e.g., ovonic threshold switch (OTS) material, concentrically arranged around the conductive extension 554. Although FIG. 5 shows the PCM 552 is arranged adjacent to the conductive extension 554, and the OTS material 550 is arranged concentric to the PCM 552, embodiments of the present disclosure are not so limited. According to a number of embodiments, the OTS material 550 is arranged adjacent to the conductive extension 554, and the PCM 552 is arranged concentric to the OTS material 550.

Figure 6A:
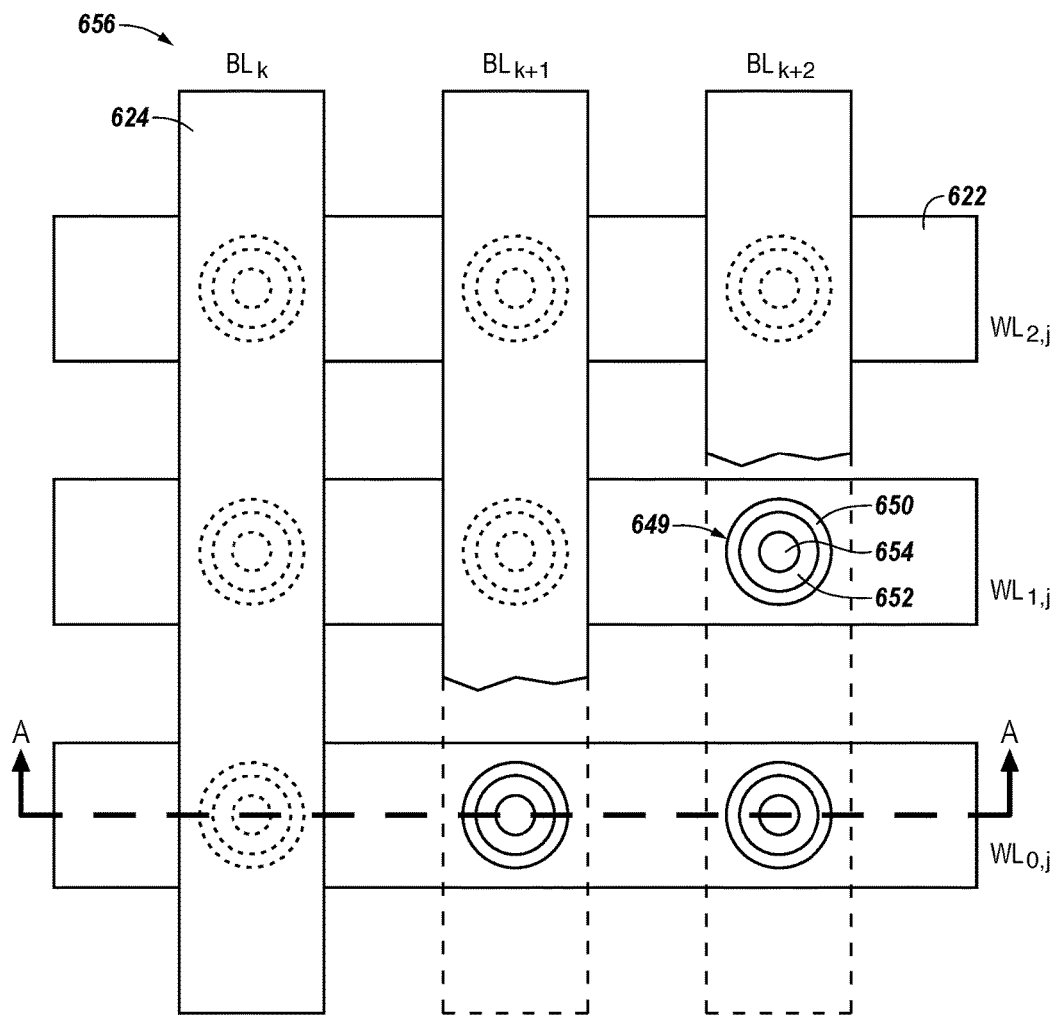
FIG. 6A illustrates location of concentric memory cells within a grid of conductive lines in accordance with a number of embodiments of the present disclosure.
Figure 6B:
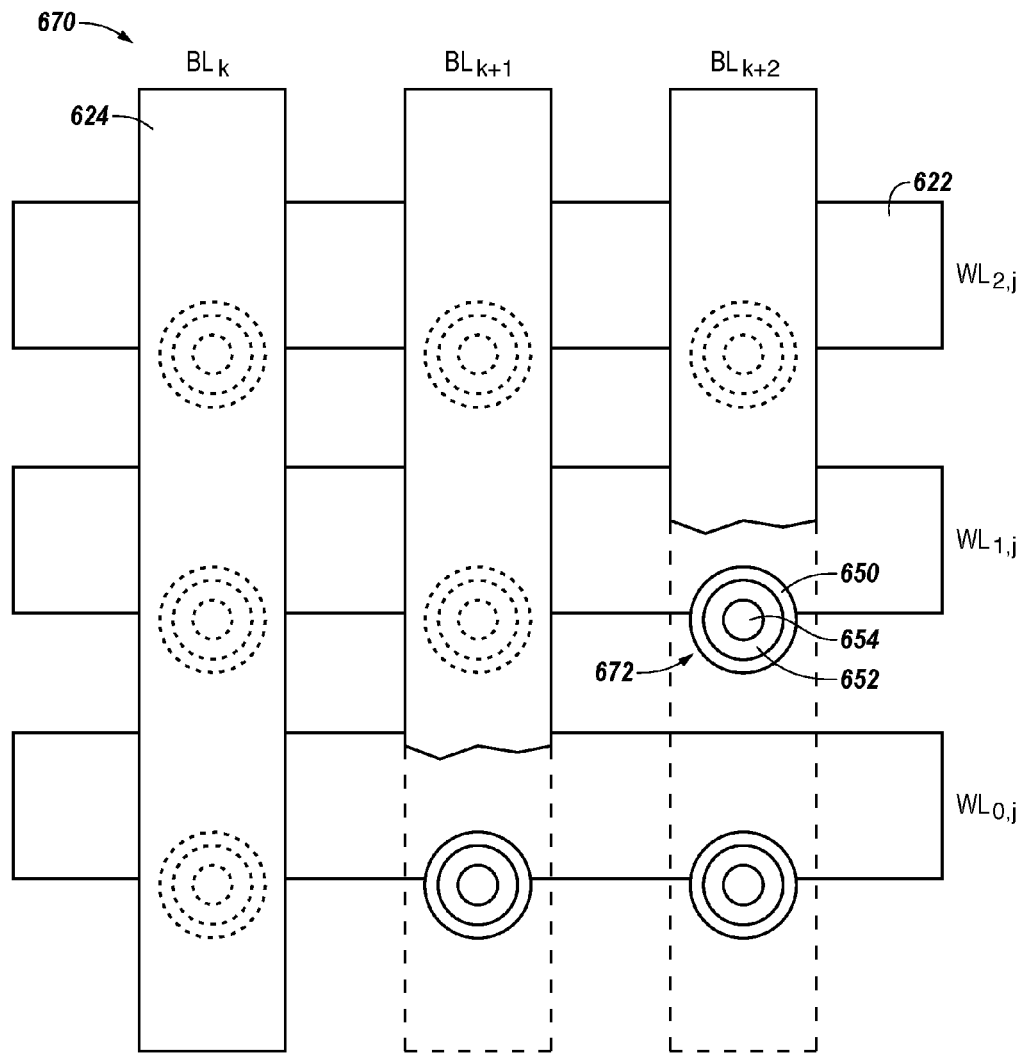
FIG. 6B illustrates location of concentric memory cells partially within a grid of conductive lines in accordance with a number of embodiments of the present disclosure.
Figure 6C:
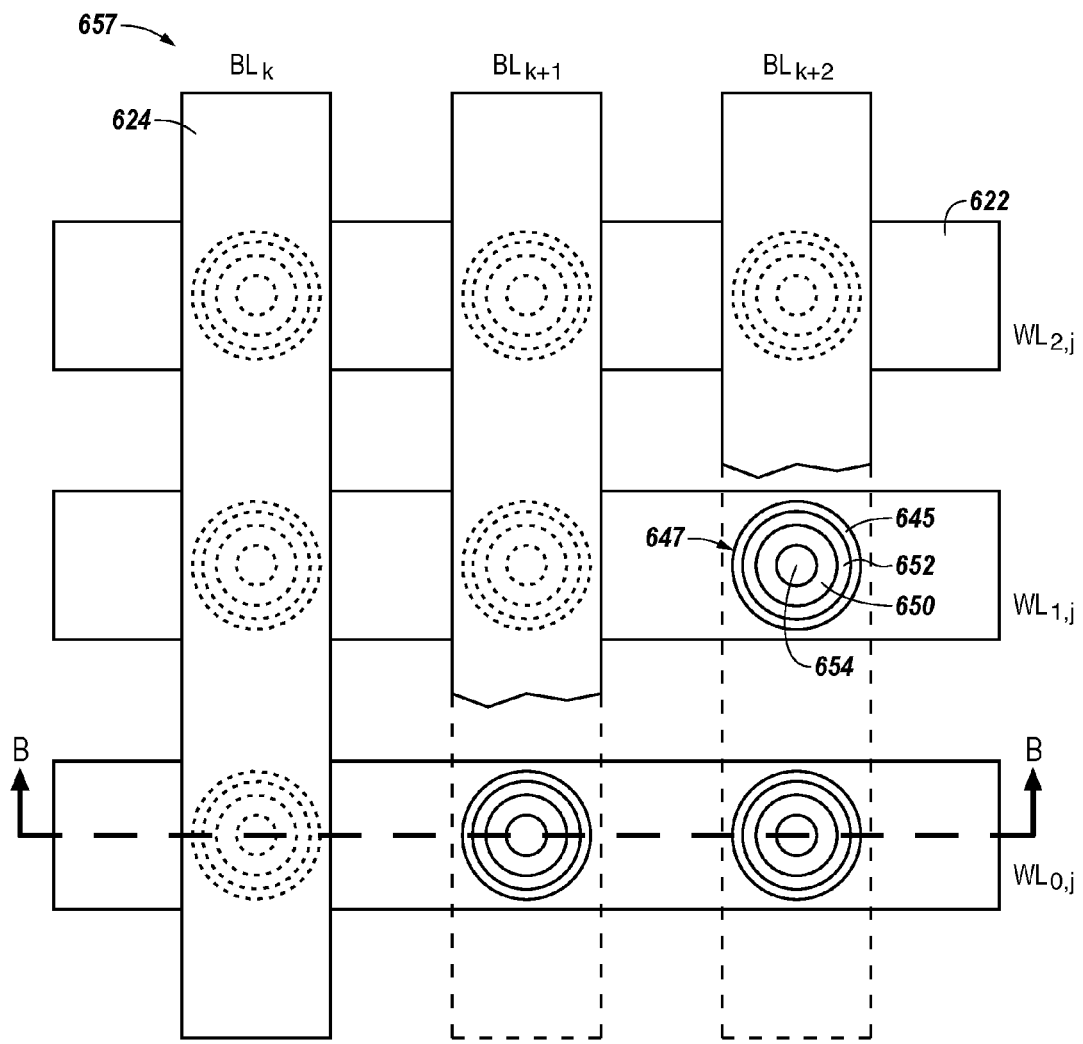
FIG. 6C illustrates location of concentric memory cells having concentric heater material within a grid of conductive lines in accordance with a number of embodiments of the present disclosure.

Although not shown in FIG. 5 for clarity, additional materials may be concentrically formed between the conductive extension 554 and a respective conductive line 522, such as a heater material discussed further with respect to FIG. 6C. Another example is a material formed between the storage element material 552 and the cell select device material 550 to separate and/or provide protection between the storage element material 552 and the cell select device material 550, to mitigate composition mixing, for instance.

Where the conductive extension 554, concentric PCM 552, and concentric OTS material 550 passes in proximity to a respective conductive line 522, a concentric memory cell, including a storage element connected in series with a respective cell select device, is formed between the conductive extension 554 and the conductive line 522. Concentric memory cells may be formed substantially at the same levels as word lines are formed, such that a concentric memory cell is substantially co-planar with a conductive line 522.

The storage element can be a resistance variable storage element. The resistance variable storage element may include a PCM, for instance, among other resistance variable storage element materials. In embodiments in which the resistance variable storage element comprises a PCM, the phase change material can be a chalcogenide alloy such as an indium (In)-antimony (Sb)-tellurium (Te) (IST) material, e.g., $In_2Sb_2Te_5$, $In_1Sb_2Te_4$, $In_1Sb_4Te_7$, etc., or a germanium (Ge)-antimony (Sb)-tellurium (Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the storage elements of the memory cells. For instance, other examples of resistive variable materials that can be used to form storage elements include binary metal oxide materials, colossal magnetoresistive materials, and/or various polymer based resistance variable materials, among others.

The memory cells comprising a cell select device in series with a phase change material, can be referred to as phase change material and switch (PCMS) memory cells. In a number of embodiments, the concentrically arranged cell select device functions as a two-terminal OTS, for instance. The OTS material can include, for example, a chalcogenide material that is responsive to an applied voltage across the OTS. For an applied voltage that is less than a threshold voltage, the OTS remains in an "off" state, e.g., an electrically nonconductive state. Alternatively, responsive to an applied voltage across the OTS that is greater than the threshold voltage, the OTS enters an "on" state, e.g., an electrically conductive state. Responsive to an applied voltage near a threshold voltage, the voltage across the OTS may "snapback" to a holding voltage.

In a number of embodiments, the concentrically-formed storage element can function as a two-terminal phase change storage element. However, embodiments of the present disclosure are not limited to PCMS cross-point arrays or a particular cell select switch. For instance, the methods and apparatuses of the present disclosure can be applied to other cross-point arrays such as arrays utilizing resistive random access memory (RRAM) cells, conductive bridging random access memory (CBRAM) cells, and/or spin transfer torque random access memory (STT-RAM) cells, among other types of memory cells, for example.

In a number of embodiments, the resistance variable storage element material can comprise one or more of the same material(s) as the cell select device material. However, embodiments are not so limited. For example, the resistance variable storage element material and the cell select device material can comprise different materials.

The materials described herein may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations. Fabrication techniques are discussed further with respect to FIG. 7A-9C.

FIG. 6A illustrates location of concentric memory cells within a grid of conductive lines in accordance with a number of embodiments of the present disclosure. FIG. 6A shows a top view of a portion of a memory array 656. The memory array 656 includes a plurality of first conductive lines 622, e.g., word lines, and a plurality of second conductive lines 624, e.g., bit lines, arranged perpendicular to the first conductive lines 622.

For example, the first conductive lines 622 and second conductive lines 624 can be formed of a metallic material, a polysilicon material, e.g., doped polysilicon material, among others. Other levels of first conductive lines 622, e.g., other levels of word lines, can be present below the word lines in level j shown in FIG. 6A. The first conductive lines 622 and second conductive lines 624 overlap and thereby form a grid of conductive lines.

The first conductive lines 622 at a number of elevations can be formed, for example, by patterning a first stack alternating conductive materials and insulating materials into a number of discrete stacks. That is, the alternating conductive materials and insulating materials can be etched to form trenches (laterally) between a number of stacks of conducting/insulating materials defining a footprint of first conductive lines. The trenches between the number of stacks so formed can be filled with insulating materials, e.g., dielectric, in order to separate first conductive lines at a particular elevation from one another.

Each stack can comprise a plurality of first conductive lines 622 (vertically) separated from one another by insulating material, and (laterally) separated from other first conductive lines 622, e.g., in other stacks, by the insulating material used to fill the trenches. A profile view of one such stack is shown, for example, with respect to FIG. 7A, among others.

Second conductive lines 624 can be similarly formed by patterning, etching, and forming insulating materials between respective second conductive lines. However, as second conductive lines may be formed at only one elevation (at a time), so that such formation may not involve a stack of alternating conductive and insulating materials. As used herein, a "footprint" of a conductive line refers to the outline of a particular conductive line when formed, e.g., the outline of a stack comprising first conductive lines. Vias may be formed through portions of the first and second conductive lines in subsequent processing, which may change the resulting boundary of a conductive line; however, the term "footprint" is used herein in referring to the original boundaries of the first conductive line, e.g., immediately prior to the formation of a via therethrough.

As shown in FIG. 6A, concentric memory cells 649, such as those described with respect to FIG. 5, can be formed at location where the first conductive lines 622 and second conductive lines 624 overlap. That is, the concentric memory cells 649 can be formed where the first conductive lines 622 and second conductive lines 624 appear to intersect. Because the first conductive lines 622 and second conductive lines 624 are formed at different levels, they do not actually intersect one another. One memory cell 649 is formed at each word line-bit line overlap, e.g., at each level of the plurality of conductive line levels (indicated by j in FIG. 6A).

Conductive extension 654 is substantially orthogonal to first conductive lines 622 and second conductive lines 624, e.g., it extends through the page in FIG. 6A. FIG. 6A shows in cross section (in a plane parallel to conductive lines 622) a conductive extension 654 passing through each first conductive line 622, for example, passing through a center line of a respective first conductive line 622. A storage element material 652, e.g., phase change material (PCM), and cell select device material 650, e.g., ovonic threshold switch (OTS) material, can be concentrically arranged around the conductive extension 654. Although FIG. 6A shows the storage element material 652 is arranged adjacent to the conductive extension 654, and the cell select device material 650 is arranged concentric to the storage element material 652, embodiments of the present disclosure are not so limited, and the cell select device material 650 can be arranged to be adjacent to the conductive extension 654 with the storage element material 652 arranged concentric to the cell select device material 650.

As shown in FIG. 6A, the conductive extension 654 can also be arranged to extend from a location on the center line of the second conductive lines 624. However, embodiments are not so limited, and the conductive extension 654 can be coupled to a respective second conductive line 624 offset from a center line location while still passing through a center line of the first conductive line, e.g., by varying slightly in horizontal positioning from that shown in FIG. 6A.

FIG. 6A shows the concentric memory cells 649 are located within a footprint, e.g., inside the outline of the structure, of the first conductive lines 622 at each level where first conductive lines 622 are formed in the stack of materials. That is, a cross-section of the conductive extension 654, the storage element material 652, and the cell select device material 650 is wholly located within a footprint of the first conductive line 622 as these concentrically-arranged materials pass through a first conductive line 622 formed at each of a plurality of levels. The cut line A-A shown in FIG. 6A provides a reference for the views shown in FIGS. 7A-7C.

FIG. 6B illustrates location of concentric memory cells partially within a grid of conductive lines in accordance with a number of embodiments of the present disclosure. FIG. 6B shows a top view of a portion of a memory array 670. The memory array 670 includes a plurality of first conductive lines 622, e.g., word lines, and a plurality of second conductive lines 624, e.g., bit lines, arranged perpendicular to the first conductive lines 622. Other levels of first conductive lines 622, e.g., other levels of word lines, can be present below the word lines in level j shown in FIG. 6B. The first conductive lines 622 and second conductive lines 624 overlap and thereby form a grid of conductive lines.

As shown in FIG. 6B, concentric memory cells 672, similar in structure but different in location with respect to the first conductive lines 622 to those described with respect to FIG. 5, can be formed at location in proximity to where the first conductive lines 622 and second conductive lines 624 overlap. That is, the concentric memory cells 672 can be formed near where the first conductive lines 622 and second conductive lines 624 appear to intersect (the first conductive lines 622 and second conductive lines 624 are formed at different levels such that they do not actually intersect one another). One concentric memory cell 672 can be formed in proximity of each word line-bit line overlap, e.g., at each level of the plurality of conductive line levels (indicated by j in FIG. 6B).

A storage element material 652 and cell select device material 650 can be concentrically arranged around the conductive extension 654. Although FIG. 6B shows the storage element material 652 is arranged adjacent to the conductive extension 654, and the cell select device material 650 is arranged concentric to the storage element material 652, embodiments of the present disclosure are not so limited, and the cell select device material 650 can be arranged to be adjacent to the conductive extension 654 with the storage element material 652 arranged concentric to the cell select device material 650.

Conductive extension 654 is substantially orthogonal to first conductive lines 622 and second conductive lines 624, e.g., it extends through the page in FIG. 6B. FIG. 6B shows in cross section (in a plane parallel to conductive lines 622) a conductive extension 654, the storage element material 652, and the cell select device material 650 passing through a portion of each first conductive line 622, such that these concentrically-arranged materials are not completely surrounded, e.g., enclosed at the level of each first conductive line 622, by the first conductive line 622. As such, only a portion of the circumference of the storage element material 652 and/or cell select device material 650 are in contact with the first conductive line 622 (at the level of the first conductive line 622). In this manner, the volume of the storage element material 652 involved in a phase change is less than when the storage element material 652 and/or cell select device material 650 passes wholly through the first conductive line 622.

For example as shown in FIG. 6B, materials comprising the concentric memory cell 672 can be arranged such that a centerline of the concentric memory cell 672 is aligned with an edge, e.g., along a longest dimension, of a respective first conductive line 622. That is, materials comprising the concentric memory cell 672 can be located one-half within and one-half outside a footprint of a respective first conductive line 622. However, embodiments of the present disclosure are not so limited, and materials comprising the concentric memory cell 672 can be located so as to have some portion located within and a remaining portion located outside a footprint of a respective first conductive line 622.

By this arrangement, only a portion of the materials comprising the concentric memory cell 672 are located between conductive extension 654 and the first conductive line 622. As such, a reduced volume of storage element material 652 is effectively used in storing information. Accordingly, less energy can be required to program and/or erase the reduced volume of storage element material 652, such as in forming an amorphous region in the PCM. Also, the useful section for first conductive line 622 sinking current is increased with respect to a same width of first conductive line 622 in the case where the conductive extension 654 passes through, e.g., a center of, and is fully surrounded by the first conductive line 622, such as is shown in FIG. 6A. Alternatively, a reduced effective memory cell size is obtained by using a smaller first conductive line 622 width for a given resistivity per unit length; however, such an approach is more sensitive to misalignment between the concentric memory cell 672 and the first conductive line 622.

FIG. 6C illustrates location of concentric memory cells 647 having concentric heater material within a grid of conductive lines in accordance with a number of embodiments of the present disclosure. FIG. 6C shows a top view of a portion of a memory array 657. The memory array 657 includes a plurality of first conductive lines 622, e.g., word lines, and a plurality of second conductive lines 624, e.g., bit lines, arranged perpendicular to the first conductive lines 622. Other levels of first conductive lines 622, e.g., other levels of word lines, can be present below the word lines in level j shown in FIG. 6C. The first conductive lines 622 and second conductive lines 624 overlap and thereby form a grid of conductive lines.

As shown in FIG. 6C, concentric memory cells 647, of similar structure to those described with respect to FIG. 5 but with an additional concentric material, can be formed at location where the first conductive lines 622 and second conductive lines 624 overlap. That is, the concentric memory cells 647 can be formed where the first conductive lines 622 and second conductive lines 624 appear to intersect. However, the first conductive lines 622 and second conductive lines 624 are formed at different levels so they do not actually intersect one another. One concentric memory cell 647 can be formed in proximity of each word line-bit line overlap, e.g., at each level of the plurality of conductive line levels (indicated by j in FIG. 6C).

FIG. 6C shows in cross section a conductive extension 654 passing through each first conductive line 622, for example, passing through a center line of a respective first conductive line 622. A storage element material 652, e.g., phase change material (PCM), and cell select device material 650, e.g., ovonic threshold switch (OTS) material, can be concentrically arranged around the conductive extension 654. A heater material 645 can be concentrically arranged around the conductive extension 654, storage element material 652 and/or cell select device material 650 such that the heater material 645 is adjacent to the storage element material 652, as shown in one configuration in FIG. 6C. It should be noted that the relative positioning of the storage element material 652 and cell select device material 650 is reverse in FIG. 6C from that shown in FIG. 6A (so that the storage element material 652 is positioned adjacent the heater material 645), e.g., an alternate configuration as discussed with respect to FIG. 6A.

The structure of a concentric memory cell that includes only a PCM memory element and an OTS, e.g., concentric memory cell 649 shown in FIG. 6A, can require a relatively high amount of current in order to completely form an amorphous region at the entire interface between the OTS and the PCM. For a circular footprint of the concentric memory cell 649, the active volume is about $2\pi r \cdot tGST \cdot tWL$ where $2\pi r$ is the circumference of the vertical conductive extension 654, tGST is the thickness of PCM material 652, and tWL is the thickness of first conductive line 622. The active volume can be reduced by making the first conductive line 622 thinner, at the expense of increased resistance for the first conductive line 622.

According to a number of embodiments of the present disclosure, the effective thickness of the first conductive line 622 can be reduced while substantially maintaining overall resistance of the majority of the first conductive lines 622 to acceptable magnitudes by forming, e.g., depositing, a thin heater material 645 (thin relative to the thickness of the first conductive line 622 material) adjacent a thick first conductive line 622 material (thick relative to the thickness of the heater material 645).

The concentric memory cell 647 can be configured such that only the thin heater material 645 is in contact with the storage element material 652 and/or cell select device material 650, which serves to funnel current passing through the first conductive lines 622 into a smaller cross-section, thereby increasing localized current flow in the storage element material 652. The relatively thicker profile of the first conductive lines 622 provides a lower resistance of the first conductive lines 622, and the relatively thinner heater material 645 near the storage element material 652 decreases the effective cross-sectional area of the first conductive lines 622 at the concentric memory cells 647 so as to concentrate current flow. As such, the thin heater material 645 effectively reduces the active volume being subjected to phase change (because of the relatively thinner heater material 645 thickness) and may act as a heater that can heat-up by a Joule effect, therefore providing more concentrated energy and increased temperature to the adjacent storage element material 652. Although the term "heater material" is used in this disclosure to distinguish from other materials and structures, embodiments of the present disclosure are not limited to heater material that itself increases in temperature. That is, "heater material" is intended to designate a material and/or structure that can concentrate current flow so as to confine a volume of the storage element material 652 involved in a phase change, and which such current concentration can increase localize temperature in a particular volume of the storage element material 652.

The effective size of a concentric memory cell, e.g., 649 shown in FIG. 6A, 672 shown in FIG. 6B, and 647 shown in FIG. 6C, of the present disclosure can be large compared to other memory cell configurations due to the coaxial arrangement and volumes of the storage element material 652 and/or cell select device material 650. As such, a single concentric memory cell may not be a minimum size for a given technology node. However, the fabrication process allows for stacking several levels of memory cells without increasing the array mask count proportionally since it is not necessary to define first conductive lines 622, e.g., word lines, and second conductive lines 624, e.g., bit lines, for each additional level.

Although FIG. 6C shows the cell select device material 650 is arranged adjacent to the conductive extension 654, and the storage element material 652 is arranged concentric to the storage element material 652, embodiments of the present disclosure are not so limited, and the cell select device material 650, the storage element material 652, and the heater material 645 can be arranged, for example, in a reversed order.

As shown in FIG. 6C, the conductive extension 654 can also be arranged to extend vertically through a location on the center line of the second conductive lines 624. However, embodiments are not so limited, and the conductive extension 654 can be coupled to a respective second conductive line 624 offset from a center line location while still passing through a center line of the first conductive line, e.g., by varying slightly in horizontal positioning from that shown in FIG. 6C.

FIG. 6C shows the concentric memory cells 647 are located within a footprint of the first conductive lines 622 at each level where first conductive lines 622 are formed in the stack of materials. That is, a cross-section of the conductive extension 654, the cell select device material 650, the storage element material 652, and the heater material 645 is wholly located within a footprint of the first conductive line 622 as these concentrically-arranged materials pass through a first conductive line 622 formed at each of a plurality of levels.

According to a number of embodiments, to improve conductivity of the first conductive lines 622 and minimize misalignment problems of the materials forming the concentric memory cells 647 passing through the first conductive line 622 so as to have a cross-section completely surrounded by material of the first conductive line 622 at some level, the first conductive lines 622 can be formed having dimensions greater than a possible minimum size since the storage element material 652 and the cell select device material 650 are more resistive than the first conductive lines 622 material.

Figure 9A:
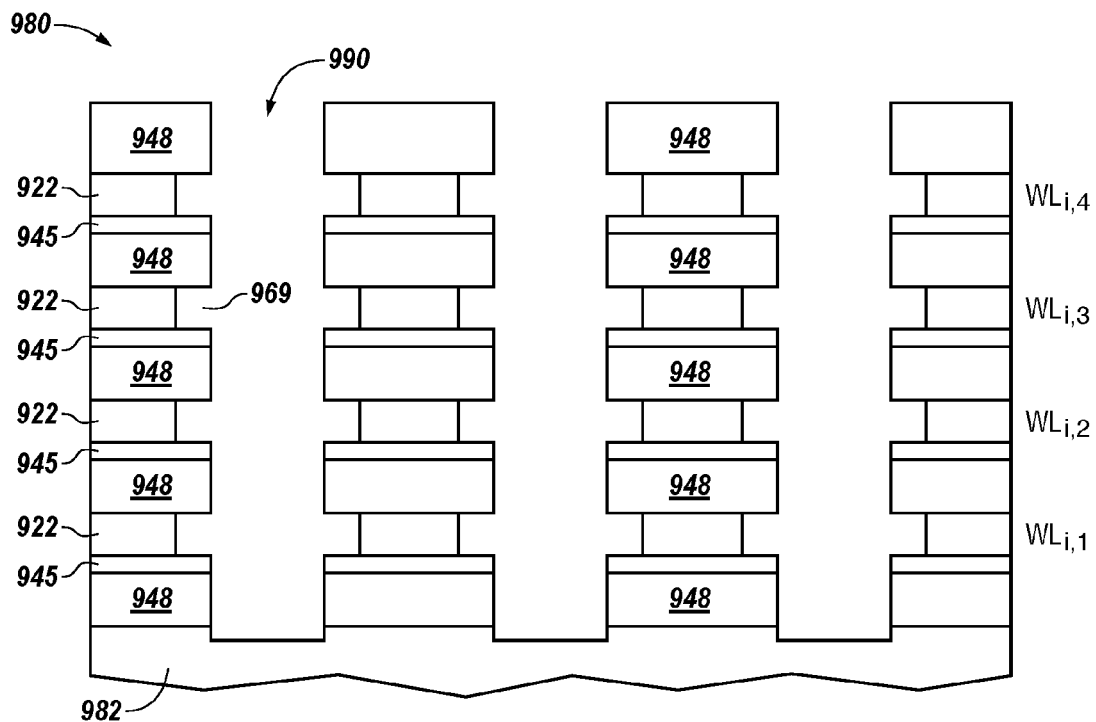
FIGS. 9A-D illustrate a simplified process flow for forming a three dimensional memory array of concentric memory cells having heater material in accordance with a number of embodiments of the present disclosure.
Figure 9B:
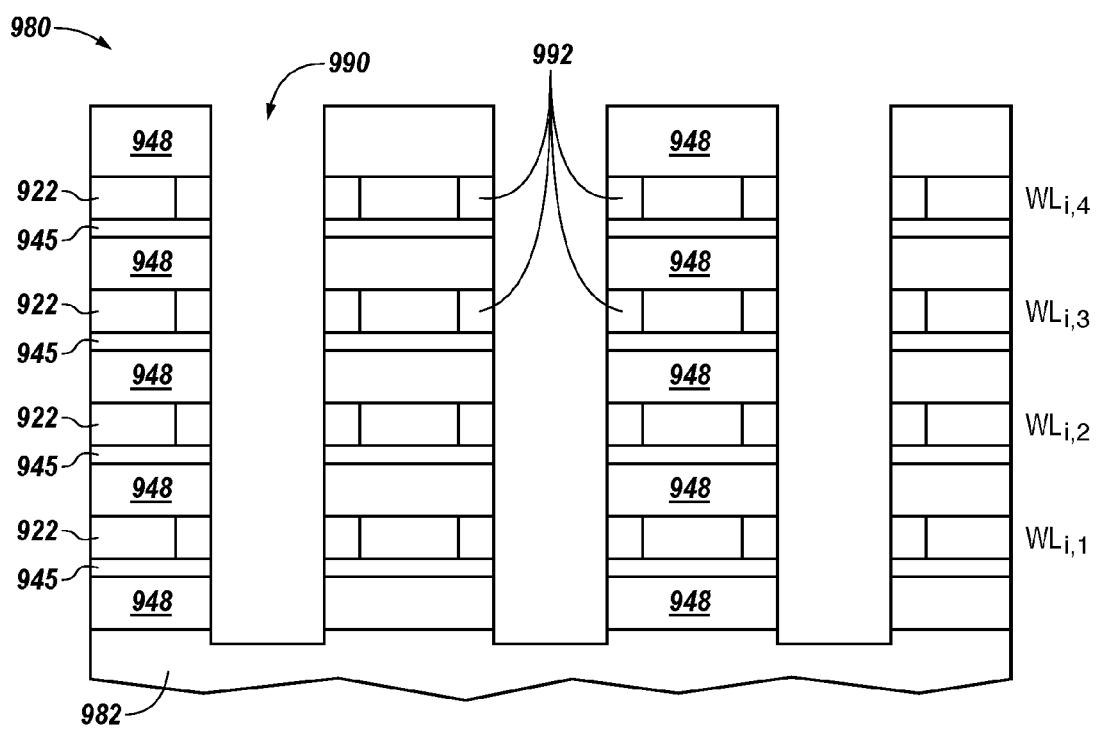
Figure 9C:
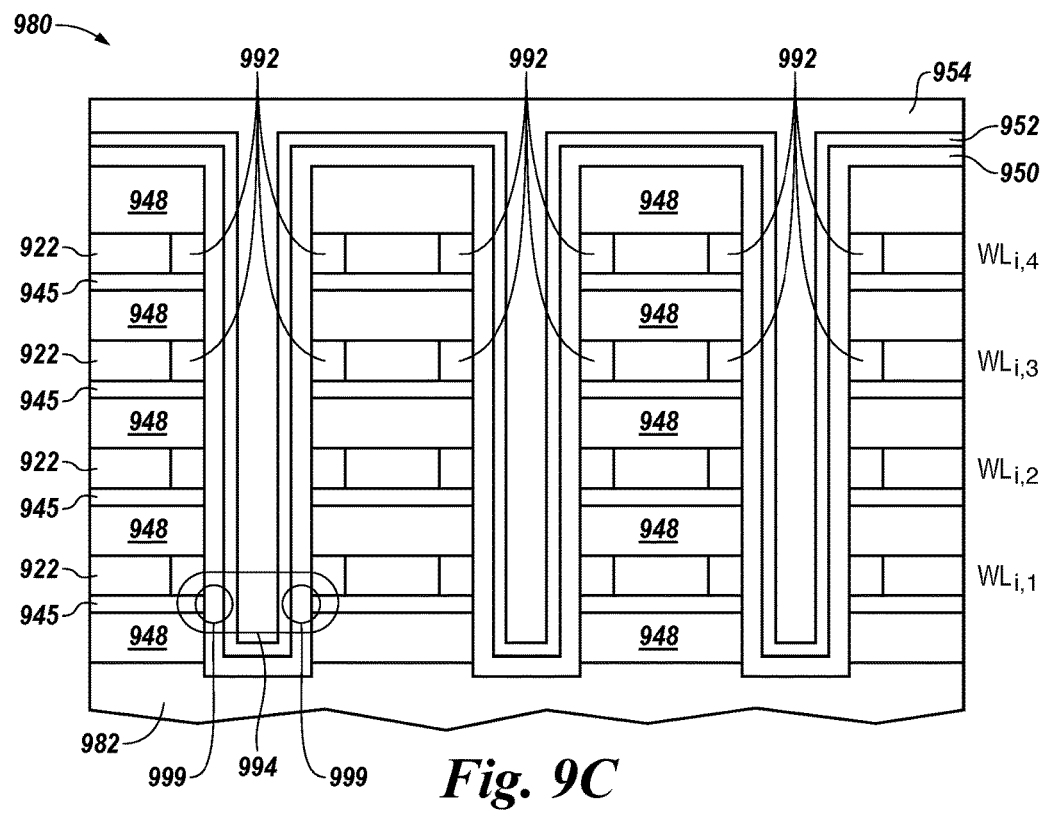

The cut line B-B shown in FIG. 6C provides a reference for the views shown in FIGS. 9A-9C.

Figure 6D:
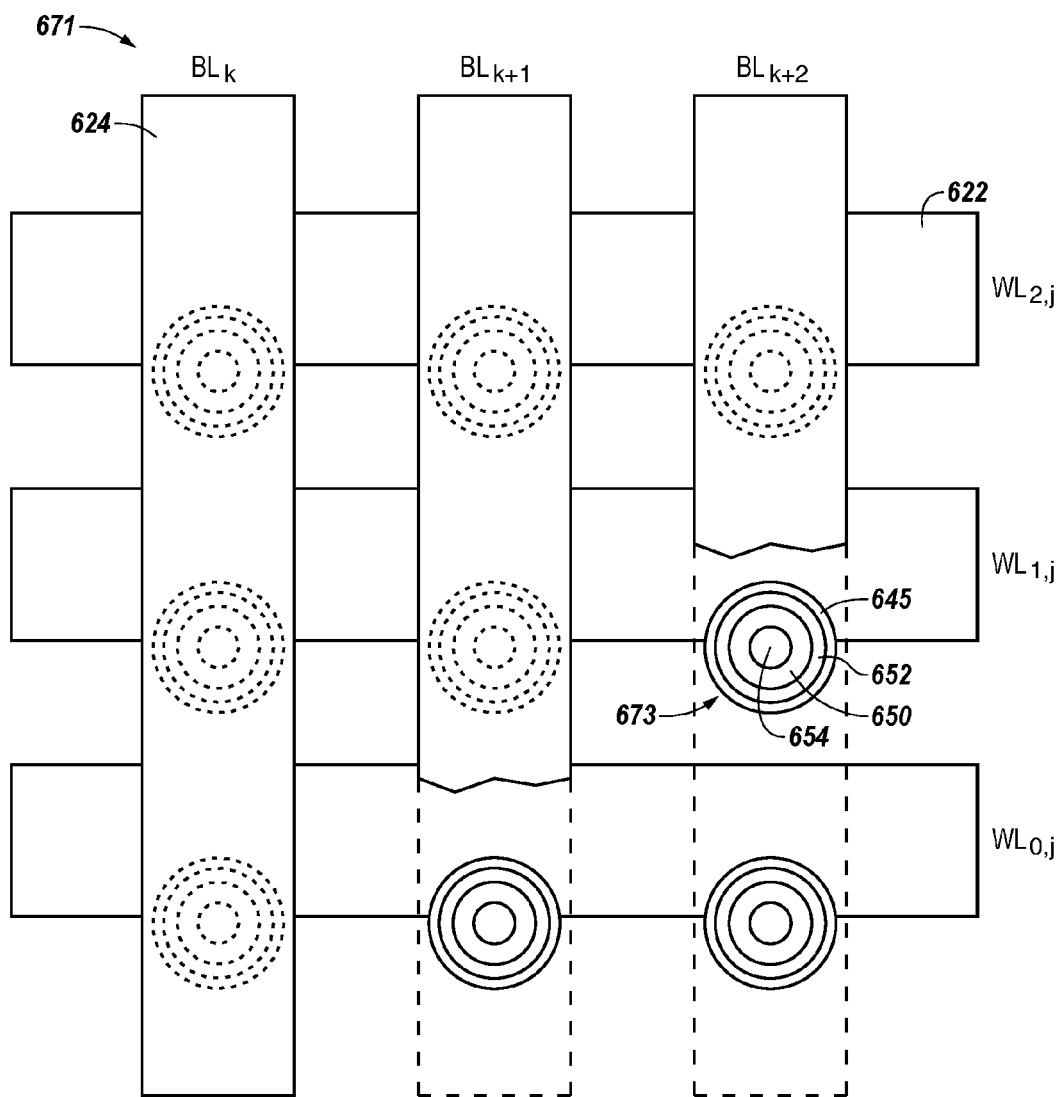
FIG. 6D illustrates location of concentric memory cells having concentric heater material partially within a grid of conductive lines in accordance with a number of embodiments of the present disclosure.

FIG. 6D illustrates location of concentric memory cells 673 having concentric heater material partially within a grid of conductive lines in accordance with a number of embodiments of the present disclosure. FIG. 6D shows a top view of a portion of a memory array 671. Concentric memory cells having concentric heater material are described above with respect to FIG. 6C. The misalignment of the concentric memory cells with the overlaps of the first conductive lines 622 and second conductive lines 624 are described above with respect to FIG. 6B, such that the concentric memory cells intersect the first conductive lines 622 in a manner that less than all of the concentric memory cells are surrounded by a particular first conductive line 622. These features can be combined, as illustrated with respect to concentric memory cells 673 in FIG. 6D. In this manner, the first conductive line 622 conductivity improvement and reduced programming energy requirements associated with a reduced active volume can be simultaneously obtained.

Figure 7A:
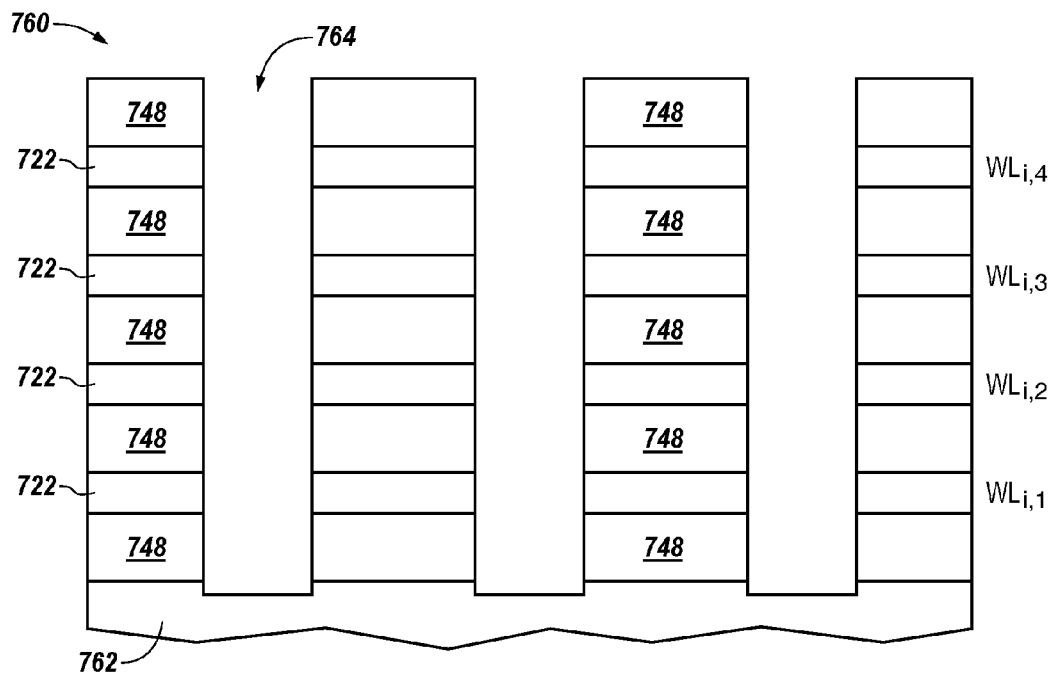
FIGS. 7A-C illustrate a simplified process flow for forming a three dimensional memory array of concentric memory cells in accordance with a number of embodiments of the present disclosure.
Figure 7B:
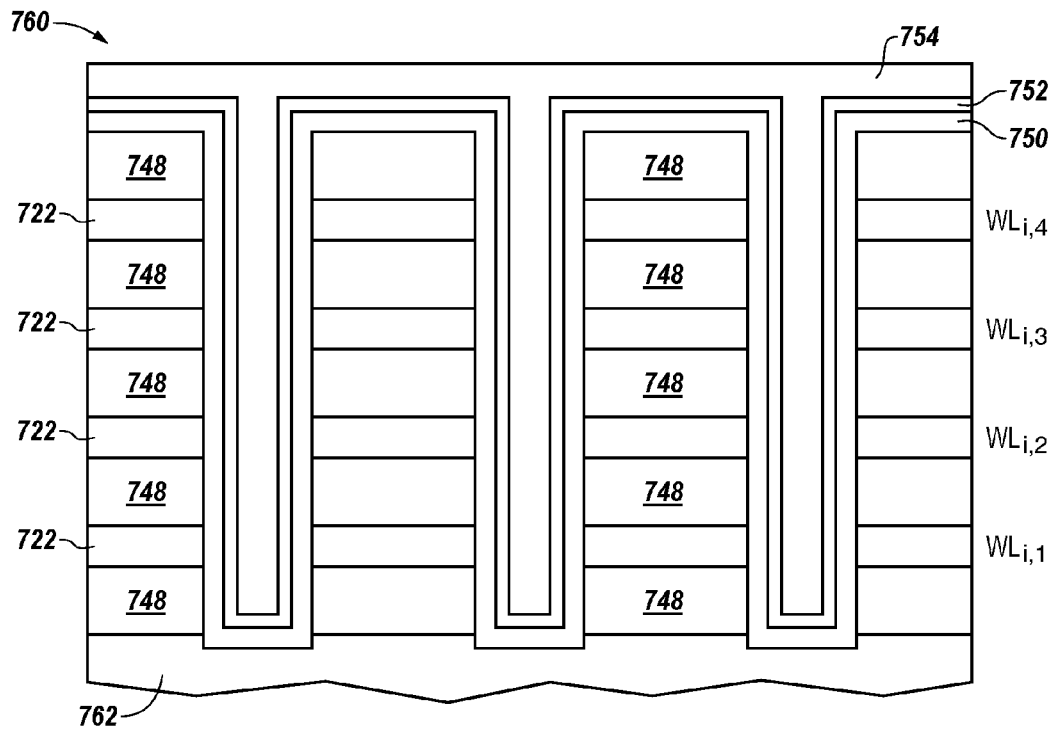
Figure 7C:
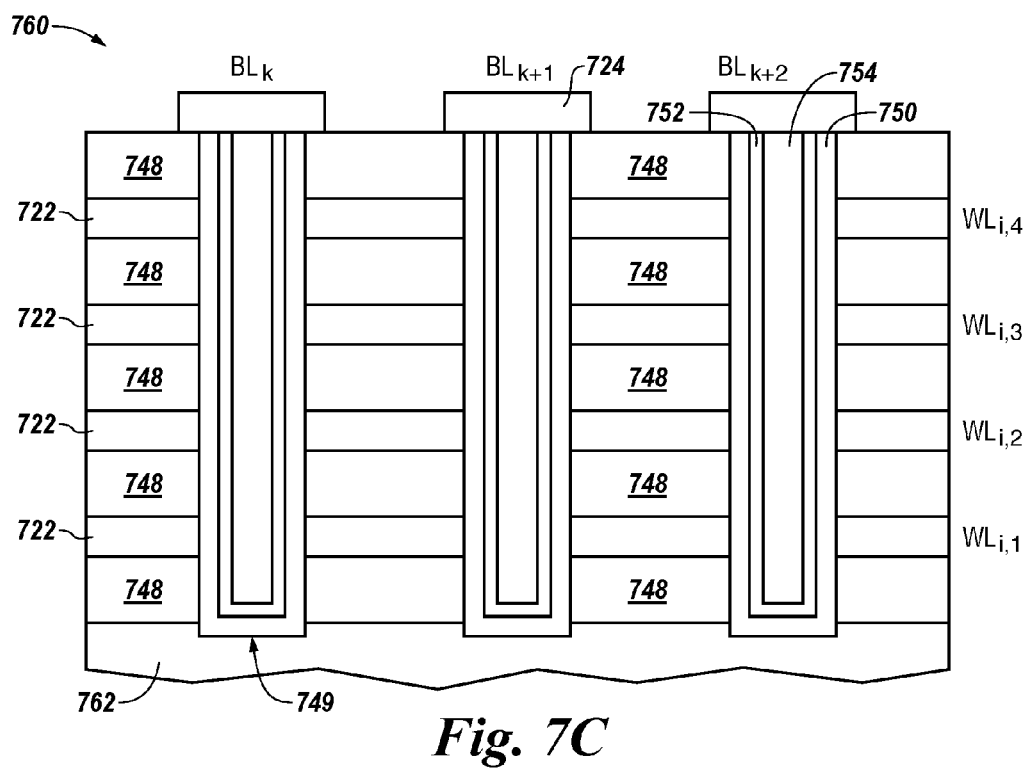

FIGS. 7A-C illustrate a simplified process flow for forming a three dimensional memory array 760 of concentric memory cells, e.g., concentric memory cells 649 shown in FIG. 6A, in accordance with a number of embodiments of the present disclosure. The view shown in FIGS. 7A-C is along cut line A-A shown in FIG. 6A. FIG. 7A shows formation, e.g., deposit, of a number of alternating insulating materials 748, e.g., dielectric, and conductive materials 722 (from which first conductive lines are formed) over an etch stop material 762, e.g., substrate material.

Vias 764, e.g., holes, can be formed, e.g., etched, through the alternating insulating materials 748 and conductive materials 722, for example stopping at the etch-stop material 762. By formation of vias a portion of conductive materials 722 can be removed such that the resulting area of the first conductive materials 722 may exclude the area removed in forming the via. However as previously discussed, the term "footprint" of the first conductive materials 722 refers to the boundary of the first conductive materials 722 just prior to forming a via therethrough, e.g., a via may pass, in whole or in part, through the footprint of the first conductive materials 722.

FIG. 7B shows that vias 764 can be filled by subsequently forming, e.g., depositing, a cell select device material 750, e.g., ovonic threshold switch (OTS) material, a storage element material 752, e.g., phase change material (PCM), and a conductive extension material 754, e.g., metallic material, such that the result is the cell select device material 750 and storage element material 752 are concentric around the conductive extension material 754, e.g., shown in FIG. 7B. As described above, other materials may be formed, e.g., deposited, before, after, and/or between cell device select material 750, storage element material 752, and/or conductive extension material 754, for example to form adhesion layers or barriers against interdiffusion of materials.

FIG. 7C shows that cell select device material 750, storage element material 752, and conductive extension material 754 can be removed above the upper, e.g., last, insulating material 748, such as by etching and/or chemical-mechanical polishing (CMP) to isolate individual concentric memory cells 749 from one another. The second conductive lines 724, e.g., bit lines, can be formed over the filled vias, such that the second conductive lines 724 are communicatively coupled to the conductive extension material 754.

According to a number of embodiments, the second conductive lines 724 can be alternatively formed using a self-aligning etch leaving the cell select device material 750 and storage element material 752 in-place above the upper insulating material 748 and below the second conductive lines 724, e.g., by directly patterning and etching the conductive extension material 754. According to another embodiment, a damascene process can be used for forming the second conductive lines 724.

Figure 8A:
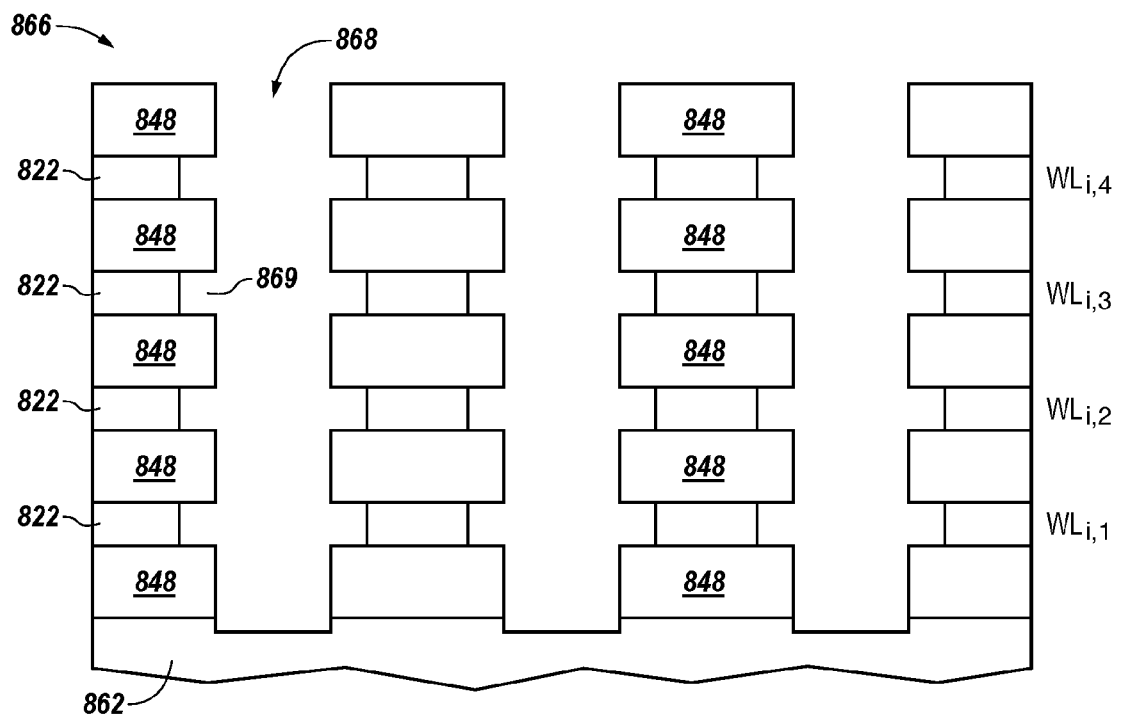
FIGS. 8A-C illustrate a simplified process flow for forming a three dimensional memory array of concentric memory cells in accordance with a number of embodiments of the present disclosure.
Figure 8B:
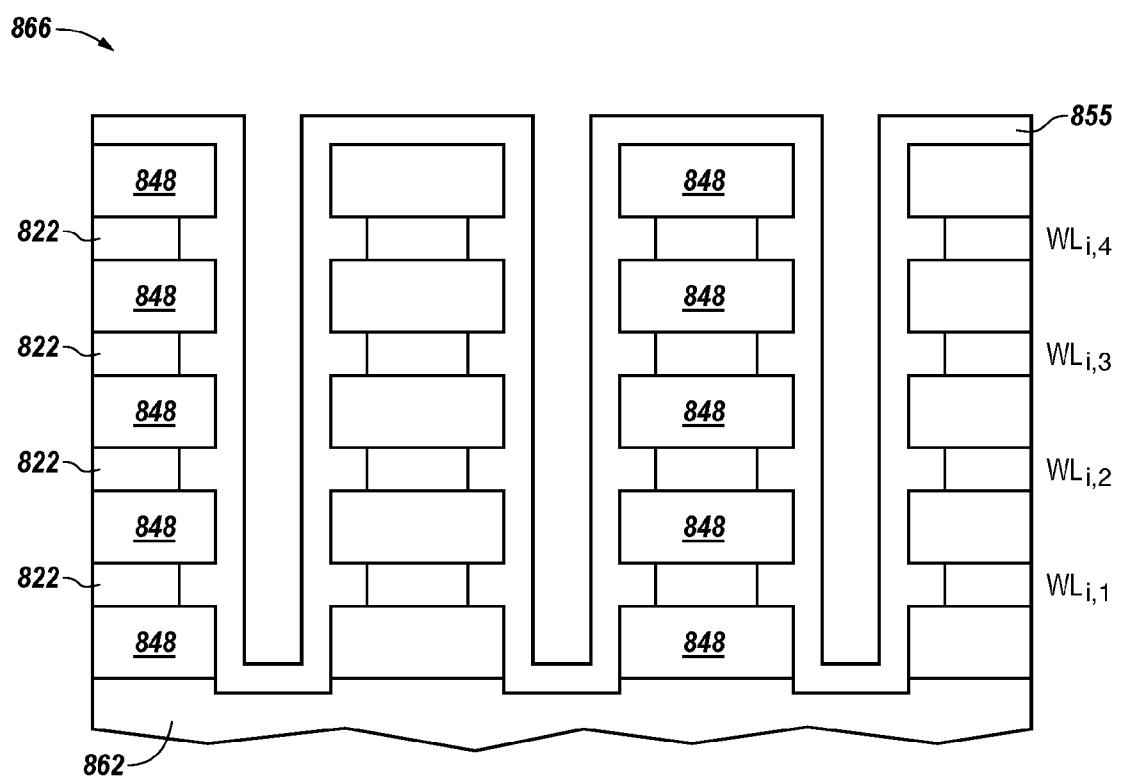
Figure 8C:
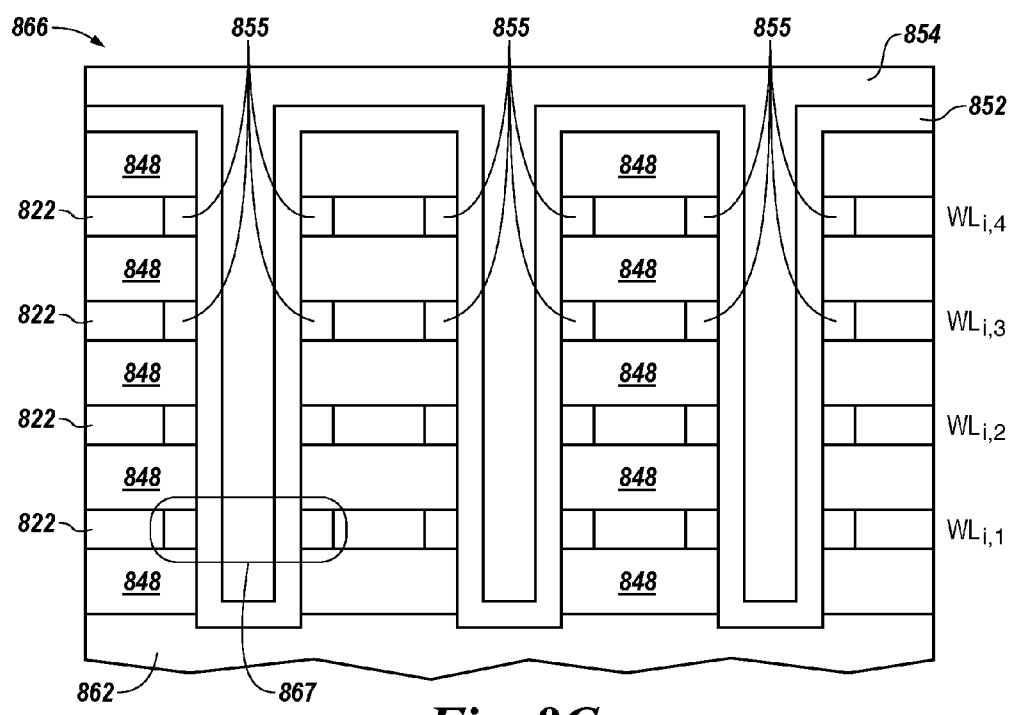

FIGS. 8A-C illustrate a simplified process flow for forming a three dimensional memory array 866 of concentric memory cells with separated switching devices in accordance with a number of embodiments of the present disclosure. It can be seen in FIG. 7C that the cell select device material 750 deposited at the outermost radial position of the concentric memory cell is contiguous vertically between different levels of first conductive lines 722. The process flow shown in FIGS. 8A-C results in the cell select device material associated with discrete memory cells, and deposited at the outermost radial position of the concentric memory cell, to be separated between different levels (corresponding to different first conductive lines).

The view shown in FIGS. 8A-C is along cut line A-A shown in FIG. 6A. Although the separation between different concentric memory cells is described here with respect to the cell select device material, the relative radial locations of cell select device material and storage element material can be swapped such that the storage element material is located at the outermost radial position of the concentric memory cell, and the storage element material is separated between different concentric memory cells.

FIG. 8A shows deposit of a number of alternating insulating materials 848, e.g., dielectric, and conductive materials 822 over a etch stop material 862. By formation of vias a portion of conductive materials 822 can be removed such that the resulting area of the first conductive materials 822 may exclude the area removed in forming the via. However as previously discussed, the term "footprint" of the first conductive materials 822 refers to the boundary of the first conductive materials 822 just prior to forming a via therethrough, e.g., a via may pass, in whole or in part, through the footprint of the first conductive materials 822. Vias, e.g., holes, can be etched through the alternating insulating materials 848 and conductive materials 822, for example stopping at the etch stop material 862 (similar to that shown in FIG. 7A for vias 764). During or after via formation the conductive materials 822 are recessed to result in the configuration of via 868 illustrated in FIG. 8A. The recesses 869 in the conductive materials 822 can be formed with a selective etch of an exposed region of the conductive materials 822 in the via 868 such as by a non-directional etch, e.g., wet etch.

FIG. 8B shows cell select device material 855 deposited into via 868, onto the sidewalls thereof, which fills the areas left by the recessed conductive materials 822 comprising the first conductive lines, as shown.

FIG. 8C shows cell select device material 855 removed from the top surface, i.e., above the upper insulating material 848, and removed from the sidewalls of the vias, such as by a directional etch, e.g., dry etch. This leaves the cell select device material 855 only in the discrete areas left by the recessed conductive materials 822. Thereafter, storage element material 852, e.g., PCM, and conductive extension 854, e.g., metallic vertical bit line extension, material can be formed in the via as shown. According to the process illustrated with respect to FIG. 8A-C, the cell select device material 855 is formed only as a plurality of discrete ring structures around the conductive extension 854 of the second conductive lines and storage element material 852 at the crossing of the first conductive lines 822, thereby reducing electrical leakage and interference between vertically adjacent concentric memory cells 867. The storage element material 852 and conductive extension 854 material can be further processed, and second conductive lines, e.g., bit lines, formed thereover, as described with respect to FIG. 7C.

FIGS. 9A-C illustrate a simplified process flow for forming a three dimensional memory array 980 of concentric memory cells 994 having heater material in accordance with a number of embodiments of the present disclosure. The formation process shown and described with respect to FIG. 9A-C is similar to that shown and described with respect to FIG. 8A-C, with the exception that an additional heater material is included. The view shown in FIGS. 9A-C is along cut line B-B shown in FIG. 6C. As discussed with respect to FIG. 6C, configurations of the concentric memory cells 994 include the storage element material 952 and heater material 945 being adjacent in order to achieve reduced programming energy requirements associated with a reduced active volume.

FIG. 9A shows deposit of a number of alternating insulating materials 948, e.g., dielectric, heater material 945, and conductive materials 922 over a etch stop material 982. By formation of vias a portion of conductive materials 922 can be removed such that the resulting area of the first conductive materials 922 may exclude the area removed in forming the via. However as previously discussed, the term "footprint" of the first conductive materials 922 refers to the boundary of the first conductive materials 922 just prior to forming a via therethrough, e.g., a via may pass, in whole or in part, through the footprint of the first conductive materials 922. Vias 990 can be etched through the alternating insulating materials 948, heater material 945, and conductive materials 922, for example stopping at the etch stop material 982.

During or after via 990 formation (similar to that shown in FIG. 8A for via 868), the conductive materials 922 can be recessed to result in the configuration illustrated in FIG. 9A. The recesses 969 in the conductive materials 922 can be formed with a selective etch of an exposed region of the conductive materials 922 in the via such as non-directional etch, e.g., wet etch. The non-directional etch can be specific to the conductive materials 922 but not (or less so) the heater material 945, which can be a different material than the conductive materials 922.

Insulating material 992 can be deposited into via 990, including onto the sidewalls thereof, filling the recesses 969, e.g., areas left by the recessed conductive materials 922 (comprising the first conductive lines). Note this is different than depositing the cell select device material 855 into the recesses 869 as shown in FIG. 8B. The insulating material 992 can be removed from the top surface, i.e., above the upper insulating material 948, and removed from the sidewalls of the vias 990, such as by a directional etch, e.g., dry etch, which can leave the insulating material 992 only in the recesses 969, e.g., discrete areas left by the recessed conductive materials 922, while exposing a portion of heater material 945 at the sidewall of vias 990, as shown in FIG. 9B.

According to a number of alternative embodiments, rather than form recesses 969 in the conductive materials 922, depositing insulating material 992 and etching to remove all but the insulating material 992 in the recesses 969, the conductive materials 922 can be selectively oxidized (with or without forming the recesses 969) to form insulating material 992.

FIG. 9C shows that vias 990 can be filled by subsequently forming, e.g., depositing, a storage element material 952, e.g., phase change material (PCM) (corresponding to storage element material 652 shown in FIG. 6C), a cell select device material 950, e.g., ovonic threshold switch (OTS) material (corresponding to cell select device material 650 shown in FIG. 6C), and a conductive extension material 954, e.g., metallic material, (corresponding to conductive extension 654 shown in FIG. 6C) such that the result is the cell select device material 952 and storage element material 950 are concentric around the conductive extension material 954 within the via 990, with the storage element material 952 being adjacent the heater material 945.

Because the area left by recessing the first conductive line material 922 is filled with insulating material 992, current flowing in the first conductive lines 922 is routed all to the heater material 945, with a relatively smaller cross-sectional area, in the vicinity of the concentric memory cell, thereby concentrating the current toward a smaller volume of storage element material 952 involved in phase changes, as indicated in FIG. 9C at 999. As discussed in detail above with respect to FIG. 6C, the use of heater material 945 effectively reduces first conductive line 922 thickness in the vicinity of the storage element material 952, thereby involving a smaller active volume in phase changes, and also increases current density in the heater material 945, which heats-up due to the Joule effect and transfers energy, i.e., raises temperature, to the storage element material 952. As such, the heater material 945 is so named since it may act as a heater.

The cell select device material 950, storage element material 952, and conductive extension material 954 can be further processed, and second conductive lines, e.g., bit lines, formed thereover, as described with respect to FIG. 7C.

Figure 9D:
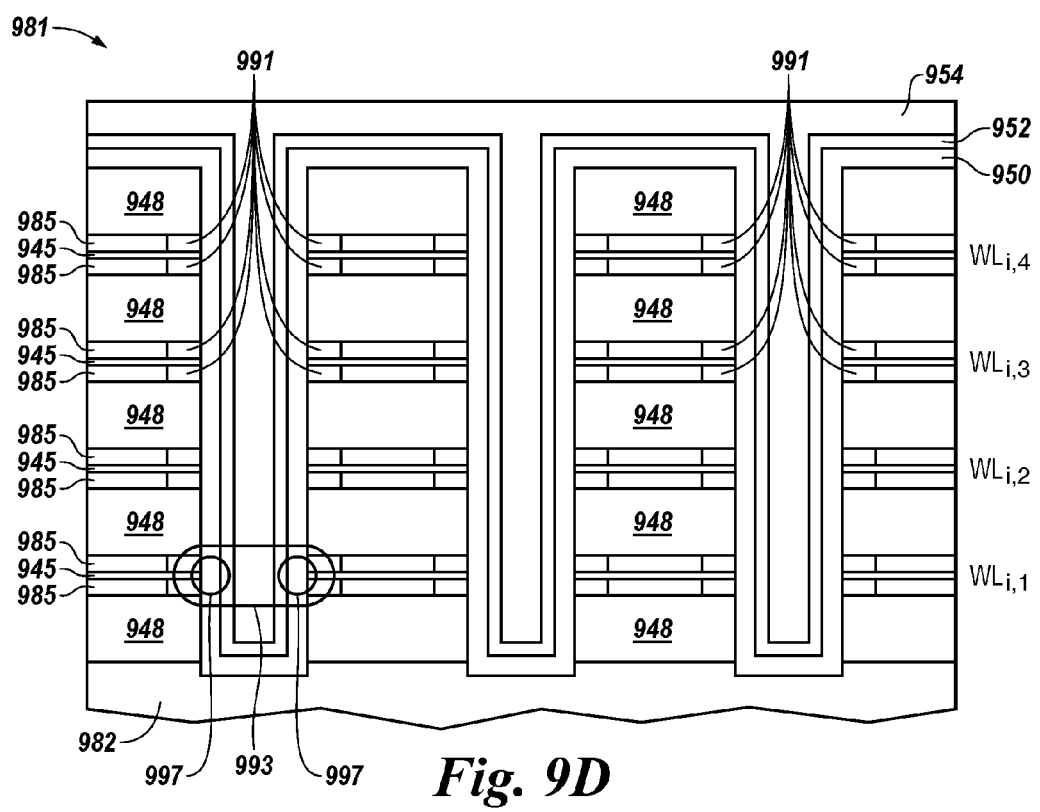

FIG. 9D illustrates the result of a process flow for forming a three dimensional memory array 981 of concentric memory cells 993 having first conductive lines, e.g., word lines, with an interceding heater material in accordance with a number of embodiments of the present disclosure. After considering FIG. 9A-C with respect to one process for forming heater materials adjacent the concentric memory cell, an alternative process for forming the heater material interceding to the first conductive lines will be understood by considering the configuration shown in FIG. 9D in comparison to the configuration shown in FIG. 9C.

The configuration of memory array 981 shown in FIG. 9D can be formed by depositing a number of instances of insulating materials 948, e.g., dielectric, conductive material 985, heater material 945, and conductive material 985 over a etch stop material 982. The two conductive materials 985 comprise the first conductive lines, e.g., word lines, which have a heater material 945 disposed therebetween, e.g., interceding to the first conductive line.

Vias 990 can be etched through the number of instances of insulating materials 948 and first conductive lines having the interceding heater material, e.g., conductive material 985, heater material 945, and conductive material 985 (similar to that shown in FIG. 8A for via 868). The conductive materials 985 can be each recessed with a non-directional etch, e.g., wet etch, similar to the result illustrated in FIG. 9A except that each heater material 945 can have a recess in the adjacent conductive materials 985 above and below the heater material 945. The non-directional etch can be specific to the conductive materials 985 but not (or less so) the heater material 945, which can be a different material than the conductive materials 985.

Insulating material 991 can be deposited into the via, including onto the sidewalls thereof, filling the areas left by the recessed conductive materials 985 above and below the heater material 945 that extends beyond the ends of the conductive materials 985. The insulating material 991 can be removed from the top surface, i.e., above the upper insulating material 948, and removed from the sidewalls of the vias, such as by a directional etch, e.g., dry etch, which can leave the insulating material 991 only in the discrete areas left by the recessed conductive materials 985, immediately above and below the heater materials 945.

The resulting vias can be filled by subsequently forming, e.g., depositing, a storage element material 952, e.g., phase change material (PCM), a cell select device material 950, e.g., ovonic threshold switch (OTS) material, and a conductive extension material 954, e.g., metallic material, such that the result is the cell select device material 950 and storage element material 952 are concentric around the conductive extension material 954, as shown in FIG. 9D. As discussed in detail above with respect to FIG. 6C, the use of heater material 945 effectively reduces first conductive line 922 thickness in the vicinity of the storage element material 952, thereby involving a smaller active volume in phase changes, and also increases current density in the heater material 945, which heats-up due to the Joule effect and transfers energy, i.e., raises temperature, to the storage element material 952. As such, the heater material 945 is so named since it may act as a heater.

During operation, current flowing in the first conductive lines, i.e., conductive materials 985, is routed all to the heater material 945, with a relatively smaller cross-sectional area, in the vicinity of the concentric memory cell, thereby concentrating the current toward a smaller volume of storage element material 952 involved in phase changes, as indicated in FIG. 9C at 997. The cell select device material 950, storage element material 952, and conductive extension material 954 can be further processed, and second conductive lines, e.g., bit lines, formed thereover, as described with respect to FIG. 7C.

It should be noted that the use of heater material, as described with respect to FIG. 9A-D can be applied to vias formed to intersect and be fully surrounded by first conductive lines within overlaps of first and second conductive lines, e.g., locations illustrated in FIG. 6C, or applied to vias formed to intersect only a portion (and not be fully surrounded by) first conductive lines, e.g., locations illustrated in FIG. 6D, among others.

The example embodiment with a "misaligned" vertical conductive extension, e.g., not intersecting a first conductive line so as to be entirely surrounded by the first conductive line, effectively reduces active volume since only a portion of the circumference, e.g., semi-circumference, of the via interacts with a given first conductive line, e.g., word line. An embodiment having a "misaligned" vertical conductive extension can also reduce memory cell space since the first conductive line width can be relatively more narrow since a smaller portion of its width is impacted by formation of the via.

Although the amount of surface area between the cell select device material, e.g., OTS, and the storage element material, e.g., PCM, is decreased, a relatively large current between these two materials may be used to amorphize the entire volume of the storage element material. The active volume is about $2\pi r*tGST*tWL$ where $2\pi r$ is the (portion) of the circumference of the storage element material at the interface with adjacent material (which can be further adjusted for configurations where only a portion of the circumference interacts with the storage element material), tGST is the active storage element material thickness, and tWL is the effective first conductive line, e.g., word line, thickness. Effective first conductive line thickness can be reduced to a thickness of a heater material 945, tH, while maintaining overall first conductive line resistance acceptable, pursuant to the embodiments illustrated with respect to FIG. 9A-D.

According to some embodiments, for each deck a thin layer of storage element material, e.g., PCM such as GST, can be flat-deposited so as to be communicatively coupled with the first conductive line material, e.g., in direct contact with the first conductive line material similar to the heater material configuration shown in FIG. 9C, or sandwiched between two layers of the first conductive line material similar to the heater material configuration shown in FIG. 9D. The first conductive line material ends at the sidewalls of a via can be recessed and insulated by selective etch or oxidation (as previously described with respect to FIGS. 9A-D but with the storage element material extending to the vertical conductive extension material, e.g., 954 in FIG. 9D), through the cell select device material. For clarity, the resulting structures are similar to those represented in FIGS. 9C and 9D and described above, with the modification that the storage element material would be represented by portions corresponding to reference number 945 in FIGS. 9C and 9D, and portions corresponding to reference number 952 would not be present.

According to some embodiments, a three dimension memory array can include a stack comprising a plurality of first conductive lines adjacent storage element material at a number of levels separated from one another by at least an insulation material. The storage element material forms a protrusion with respect to each of the plurality of first conductive lines, such as at an edge thereof. At least one conductive extension can be arranged to extend substantially perpendicular to the plurality of first conductive lines and adjacent storage element material. The cell select material can be formed within the via between the storage element material protrusion and the at least one conductive extension.

This embodiment can reduce the overall cell dimensions since only two materials are in the vertical BL portion, e.g., the cell select material and the conductive extension material. This embodiment also confines the active storage element material volume of a memory cell to between the first conductive line and the vertical conductive extension, reducing active storage element material volume to $2\pi r*tGST*EXTWL$ where $2\pi r$ is the (portion) of the circumference of the storage element material at the interface with adjacent material (which can be further adjusted for configurations where only a portion of the circumference interacts with the storage element material), tGST is the active storage element material thickness, and EXTWL is the extension of thin storage element material, e.g., GST, from the relatively thicker low-resistance first conductive line material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three dimensional memory array, comprising:
   a stack comprising a plurality of first conductive lines at a number of levels separated from one another by an insulation material;
   a storage element material substantially perpendicular to the plurality of first conductive lines and the insulation material, wherein the storage element material is in direct contact with the insulation material but not in direct contact with the first conductive lines, wherein the plurality of first conductive lines are recessed, and wherein the storage element material is separated from a first recessed conductive line of the plurality of recessed first conductive lines by at least one of a cell select device material and an insulating material within the recess; and
   a conductive extension material over the storage element material.

2. The three dimensional memory array of claim 1, wherein the cell select device material comprises a discrete ring structure around the conductive extension and the storage element material.

3. The three dimensional memory array of claim 1, wherein the storage element material is separated from the plurality of first conductive lines by an insulating material comprising a selectively oxidized portion of the plurality of first conductive lines.

4. The three dimensional memory array of claim 1, wherein the conductive extension intersects a portion of at least one of the plurality of first conductive lines.

5. The three dimensional memory array of claim 1, wherein the conductive extension is coupled to at least one of a plurality of second conductive lines extending substantially perpendicular to the plurality of first conductive lines.

6. The three dimensional memory array of claim 1, wherein the plurality of first conductive lines at the number of levels are additionally separated from one another by a heater material.

7. The three dimensional memory array of claim 6, wherein the storage element material is additionally in contact with the heater material.

8. The three dimensional memory array of claim 1, wherein each of the plurality of first conductive lines comprises a pair of conductive lines with an interceding heating material between the pair of conductive lines.

9. A method of forming a memory array, comprising:
   forming a stack comprising a plurality of first conductive lines separated from one another by insulation material;
   forming a via through the stack;
   forming a recess at each of the plurality of first conductive lines from a wall of the via;
   forming an insulating material within the recess;
   forming a storage element material within the via in direct contact with the insulation material but not in direct contact with the first conductive lines; and
   forming a conductive extension over the storage element material within the via.

10. The method of claim 9, wherein the plurality of first conductive lines are additionally separated from one another by a heater material and wherein the storage element material is in contact with the heater material.

11. The method of claim 9, wherein each of the plurality of first conductive lines includes a pair of conductive lines with an interceding heater material in between.

12. A method of forming a memory array, comprising:
   forming a stack comprising a plurality of first conductive lines at a number of levels separated from one another by at least an insulation material;
   forming at least one conductive extension extending substantially perpendicular to and intersecting with at least one of the plurality of first conductive lines; and
   forming a second conductive line over the plurality of first conductive lines and the at least one conductive extension; and
   forming storage element material around the at least one conductive extension.

13. The method of claim 12, further comprising forming a cell select material around at least a portion of the at least one conductive extension.

14. The method of claim 12, wherein the plurality of first conductive lines are recessed.

15. A method of forming a memory array, comprising:
   forming a stack comprising a plurality of first conductive lines separated from one another by insulation material;
   forming a via through the stack;
   forming a recess at each of the plurality of first conductive lines from a wall of the via;
   forming a cell select device material within the recess;
   forming a storage element material within the via in direct contact with the insulation material but not in direct contact with the first conductive lines; and
   forming a conductive extension over the storage element material within the via,
   wherein forming the cell select device material within the recess includes forming the cell select device material as a discrete ring structure around the conductive extension and the storage element material.

16. A three dimensional memory array, comprising:
   a stack comprising a plurality of first conductive lines at a number of levels separated from one another by an insulation material;
   a storage element material substantially perpendicular to the plurality of first conductive lines and the insulation material, wherein the storage element material is in direct contact with the insulation material but not in direct contact with the first conductive lines; and
   a conductive extension material over the storage element material,
   wherein each of the plurality of first conductive lines comprises a pair of conductive lines with an interceding heating material between the pair of conductive lines.

\* \* \* \* \*